US011837505B2

(12) United States Patent
Ko et al.

(10) Patent No.: US 11,837,505 B2
(45) Date of Patent: Dec. 5, 2023

(54) FORMATION OF HYBRID ISOLATION REGIONS THROUGH RECESS AND RE-DEPOSITION

(71) Applicant: Taiwan Semiconductor Manufacturing Co., Ltd., Hsinchu (TW)

(72) Inventors: Chung-Ting Ko, Kaohsiung (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/813,862

(22) Filed: Jul. 20, 2022

(65) Prior Publication Data

US 2022/0367286 A1    Nov. 17, 2022

Related U.S. Application Data

(62) Division of application No. 16/933,648, filed on Jul. 20, 2020, now Pat. No. 11,404,323.

(Continued)

(51) Int. Cl.
*H01L 21/82* (2006.01)
*H01L 21/8234* (2006.01)
(Continued)

(52) U.S. Cl.
CPC .............. *H01L 21/823481* (2013.01); *H01L 21/28518* (2013.01); *H01L 21/31051* (2013.01);
(Continued)

(58) Field of Classification Search
CPC ....... H01L 21/823481; H01L 21/28518; H01L 21/31051; H01L 21/31111;
(Continued)

(56) References Cited

U.S. PATENT DOCUMENTS 3,609,510 A    9/1971    Berkovsky et al.
7,588,985 B2    9/2009    Kim
(Continued)

FOREIGN PATENT DOCUMENTS

KR    20080029619 A    4/2008
KR    20150010547 A    1/2015
(Continued)

*Primary Examiner* — Mohammad M Hoque
(74) *Attorney, Agent, or Firm* — Slater Matsil, LLP

(57) ABSTRACT

A method includes forming a semiconductor fin protruding higher than top surfaces of isolation regions. The isolation regions extend into a semiconductor substrate. The method further includes etching a portion of the semiconductor fin to form a trench, filling the trench with a first dielectric material, wherein the first dielectric material has a first bandgap, and performing a recessing process to recess the first dielectric material. A recess is formed between opposing portions of the isolation regions. The recess is filled with a second dielectric material. The first dielectric material and the second dielectric material in combination form an additional isolation region. The second dielectric material has a second bandgap smaller than the first bandgap.

20 Claims, 27 Drawing Sheets

Related U.S. Application Data

(60) Provisional application No. 63/017,032, filed on Apr. 29, 2020.

(51) Int. Cl.
| | |
|---|---|
| *H01L 21/285* | (2006.01) |
| *H01L 21/3105* | (2006.01) |
| *H01L 21/311* | (2006.01) |
| *H01L 21/762* | (2006.01) |
| *H01L 21/764* | (2006.01) |
| *H01L 27/088* | (2006.01) |
| *H01L 29/06* | (2006.01) |
| *H01L 29/08* | (2006.01) |
| *H01L 29/45* | (2006.01) |
| *H01L 29/66* | (2006.01) |

(52) U.S. Cl.
CPC ...... *H01L 21/31111* (2013.01); *H01L 21/764* (2013.01); *H01L 21/76229* (2013.01); *H01L 21/823418* (2013.01); *H01L 21/823431* (2013.01); *H01L 21/823475* (2013.01); *H01L 27/0886* (2013.01); *H01L 29/0649* (2013.01); *H01L 29/0847* (2013.01); *H01L 29/45* (2013.01); *H01L 29/66545* (2013.01)

(58) Field of Classification Search
CPC ............. H01L 21/76229; H01L 21/764; H01L 21/823418; H01L 21/823431; H01L 21/823475; H01L 27/0886; H01L 29/0649; H01L 29/0847; H01L 29/45; H01L 29/66545; H01L 29/6681
USPC ........................................................ 257/301
See application file for complete search history.

(56) References Cited

U.S. PATENT DOCUMENTS

| | | |
|---|---|---|
| 9,412,616 B1 | 8/2016 | Xie |
| 9,520,482 B1 | 12/2016 | Chang et al. |
| 9,536,738 B2 | 1/2017 | Huang |
| 9,564,369 B1 | 2/2017 | Kim |
| 9,608,062 B1 | 3/2017 | Tseng et al. |
| 9,721,848 B1 | 8/2017 | Bu |
| 9,786,783 B2 | 10/2017 | Hafez et al. |
| 9,899,267 B1 | 2/2018 | Liou et al. |
| 9,953,975 B2 | 4/2018 | Hus et al. |
| 10,090,382 B1 | 10/2018 | Yu et al. |
| 10,665,669 B1 | 5/2020 | Xie et al. |
| 10,770,589 B2 | 9/2020 | Cheng |
| 10,784,342 B1 | 9/2020 | Hong et al. |
| 11,062,954 B2 | 7/2021 | Isu et al. |
| 11,062,961 B2 | 7/2021 | Yoo et al. |
| 2015/0021690 A1 | 1/2015 | Jacob et al. |
| 2015/0021710 A1 | 1/2015 | Hsu et al. |
| 2015/0024572 A1 | 1/2015 | Jacob et al. |
| 2015/0187571 A1 | 7/2015 | Fan et al. |
| 2015/0206954 A1 | 7/2015 | Lin |
| 2015/0318215 A1 | 11/2015 | Taylor, Jr. et al. |
| 2015/0325575 A1 | 11/2015 | Park et al. |
| 2016/0204229 A1 | 7/2016 | Tsai et al. |
| 2016/0260802 A1 | 9/2016 | Glass et al. |
| 2016/0307890 A1 | 10/2016 | Yeo et al. |
| 2016/0380052 A1 | 12/2016 | Kim et al. |
| 2017/0141210 A1 | 5/2017 | Yang |
| 2018/0047634 A1 | 2/2018 | Jun et al. |
| 2018/0053761 A1 | 2/2018 | Liou et al. |
| 2018/0068900 A1 | 3/2018 | Chang et al. |
| 2018/0151570 A1 | 5/2018 | Wang et al. |
| 2018/0158927 A1 | 6/2018 | Mohapatra et al. |
| 2018/0261596 A1 | 9/2018 | Jun et al. |
| 2018/0308742 A1 | 10/2018 | Cheng et al. |
| 2018/0315853 A1 | 11/2018 | Yu et al. |
| 2018/0358450 A1 | 12/2018 | Kim |
| 2018/0366329 A1 | 12/2018 | Kim |
| 2019/0067111 A1 | 2/2019 | Tsai et al. |
| 2019/0074211 A1 | 3/2019 | Min et al. |
| 2019/0103323 A1 | 4/2019 | Perng et al. |
| 2019/0109045 A1 | 4/2019 | Xie et al. |
| 2019/0122934 A1* | 4/2019 | Chang .................. H01L 29/785 |
| 2019/0139831 A1 | 5/2019 | Zhu |
| 2019/0148373 A1 | 5/2019 | Shi et al. |
| 2019/0164765 A1 | 5/2019 | Yeoh et al. |
| 2019/0164844 A1 | 5/2019 | Huang et al. |
| 2019/0164846 A1 | 5/2019 | Leib et al. |
| 2019/0165137 A1 | 5/2019 | Chen et al. |
| 2019/0172753 A1 | 6/2019 | Lin et al. |
| 2019/0378722 A1 | 12/2019 | Economikos et al. |
| 2020/0328121 A1 | 10/2020 | Yao et al. |

FOREIGN PATENT DOCUMENTS

| | | |
|---|---|---|
| KR | 20180018947 A | 2/2018 |
| KR | 20190026213 A | 3/2019 |
| KR | 20190062131 A | 6/2019 |
| TW | 201642474 A | 12/2016 |
| TW | 202002022 A | 1/2020 |

* cited by examiner

US 11,837,505 B2

FORMATION OF HYBRID ISOLATION REGIONS THROUGH RECESS AND RE-DEPOSITION

PRIORITY CLAIM AND CROSS-REFERENCE

This application is a divisional of U.S. patent application Ser. No. 16/933,648, entitled "Formation of Hybrid Isolation Regions Through Recess and Re-Deposition," and filed Jul. 20, 2020, which claims the benefit of the following provisionally filed U.S. Patent application: Application No. 63/017,032 filed on Apr. 29, 2020, and entitled "Bottom-Up Hybrid Formation by Deposition-Recess-Deposition Process," which applications are hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs, and for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically includes forming long semiconductor fins and long gate stacks, and then forming isolation regions to cut the long semiconductor fins and long gate stacks into shorter portions, so that the shorter portions may act as the fins and the gate stacks of FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
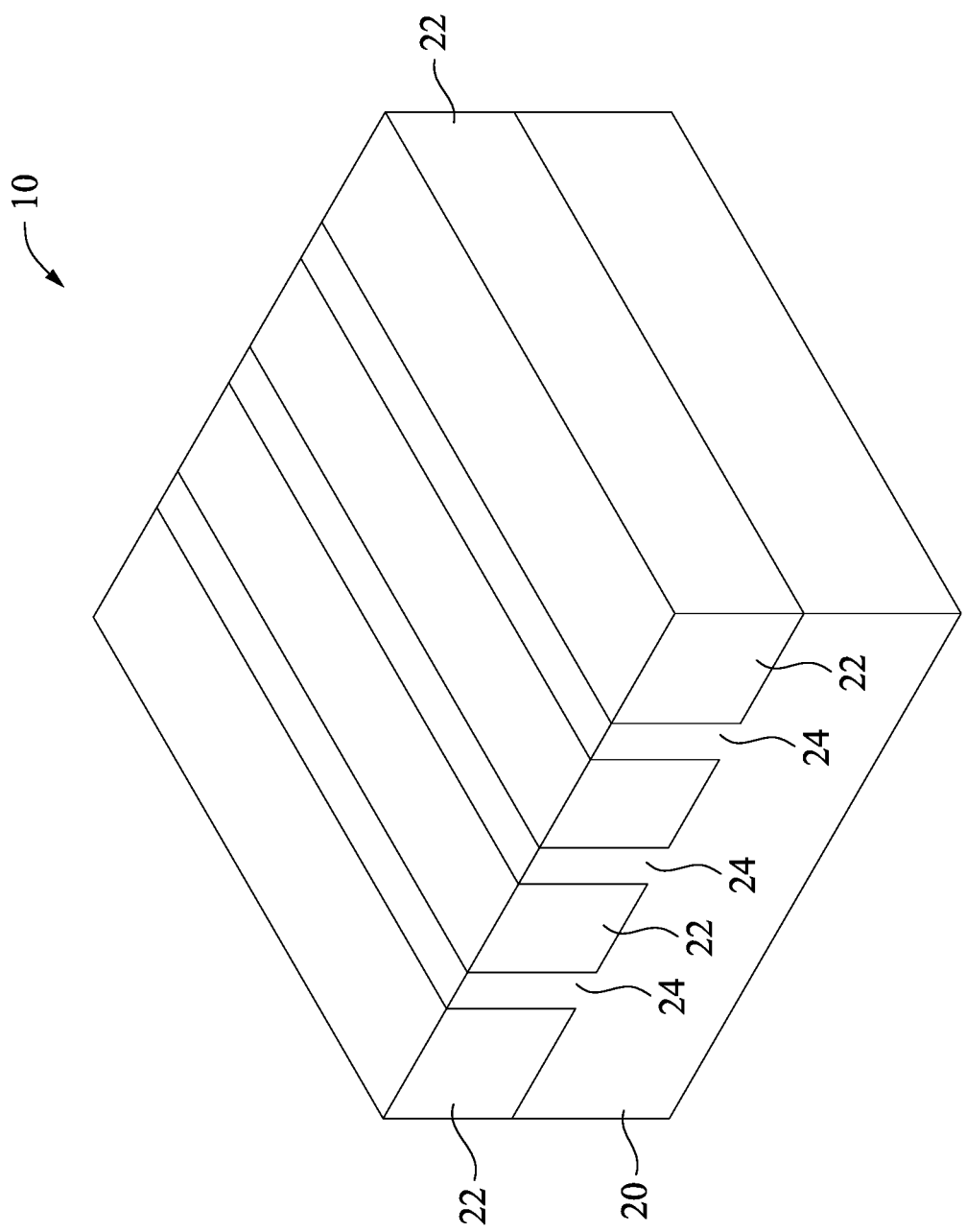
FIGS. 1-4, 5A, 5B, 6, 7A, 7B, 8A, 8B, and 9-16 illustrate the perspective views, cross-sectional views, and top views of intermediate stages in the formation of isolation regions and Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Isolation regions, Fin Field-Effect Transistors (FinFETs), and the method of forming the same are provided in accordance with some embodiments. Fin isolation regions are formed of a first dielectric material, and are then recessed. A second dielectric material different from the first dielectric material is filled into the resulting recesses to re-form the fin isolation regions. Through this process, both the requirements of leakage reduction and etching-resistance improvement are met. In some illustrated embodiments, the formation of isolations for FinFETs is used as an example to explain the concept of the present disclosure. The isolation regions of other types of transistors such as planar transistors, Gate-All-Around (GAA) transistors, or the like may also adopt the embodiments of the present disclosure to cut the corresponding active regions and gate stacks. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 24:
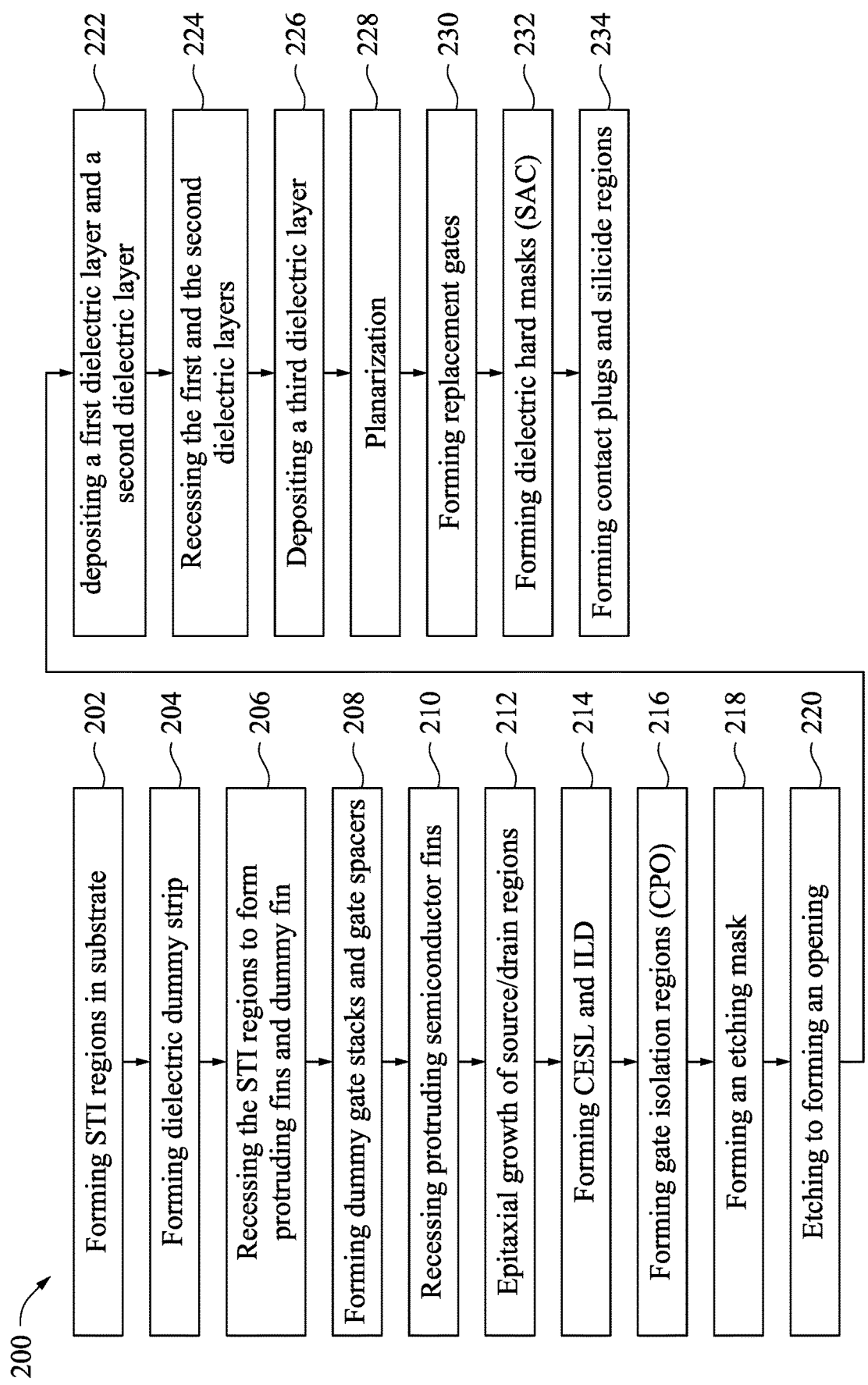
FIG. 24 illustrates a process flow for forming isolation regions and FinFETs in accordance with some embodiments.

FIGS. 1-4, 5A, 5B, 6, 7A, 7B, 8A, 8B, and 9-16 illustrate the perspective views, cross-sectional views, and top views of intermediate stages in the formation of isolation regions and Fin Field-Effect Transistors (FinFETs) in accordance with some embodiments. The corresponding processes are also reflected schematically in the process flow 200 as shown in FIG. 24.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 as shown in FIG. 24. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, SiC, SiPC, SiGe, SiGeB, Ge, a III-V compound semiconductor such as InP, GaAs, AlAs, InAs, InAlAs, InGaAs, or the like.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on coating, or the like.

Figure 2:
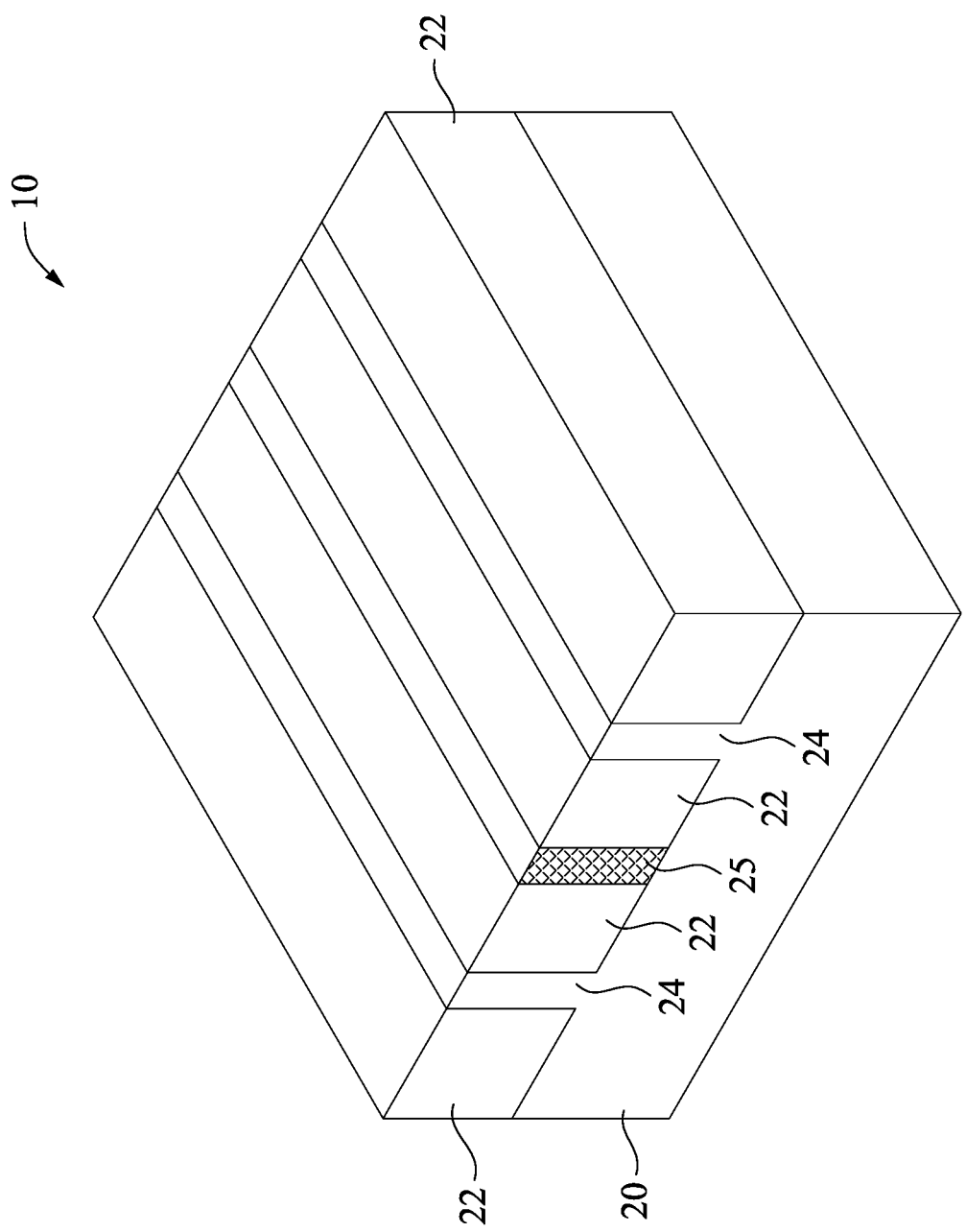

FIG. 2 illustrates the formation of dielectric dummy strip 25, which may be formed by etching one of the semiconductor strips 24 to form a recess, and then filling the recess with a dielectric material. The respective process is illustrated as process 204 in the process flow 200 as shown in FIG. 24. The dielectric material may be formed of or comprise a high-k dielectric material such as silicon nitride. Also, the material of dielectric dummy strip 25 is selected so that it has a high etching selectivity with relative to the materials of STI regions 22 (such as silicon oxide) and the materials of the subsequently formed dummy gate stacks. The bottom surface of dielectric dummy strip 25 may be higher than, level with, or lower than, the bottom surfaces of STI regions 22.

Figure 3:
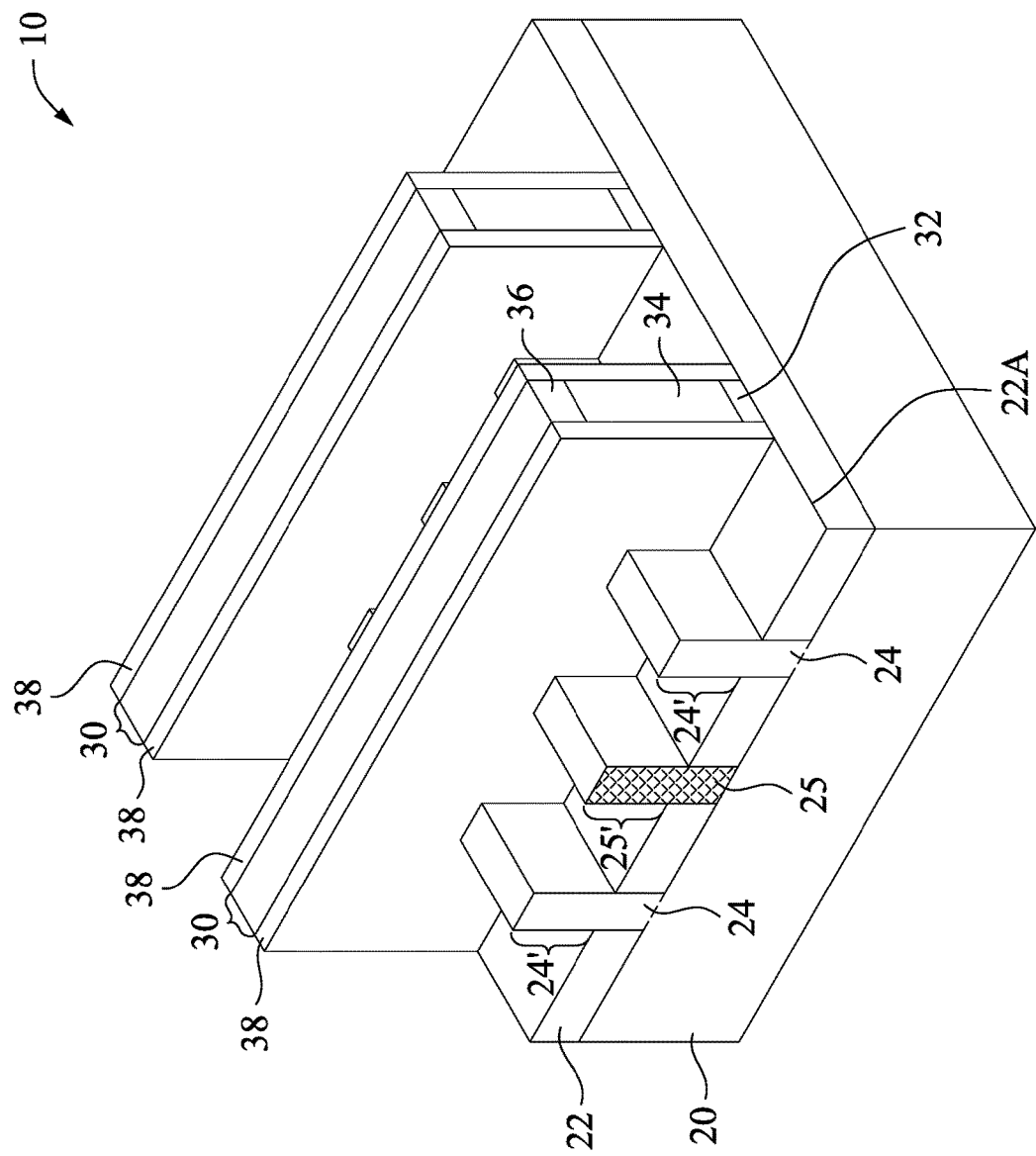

Referring to FIG. 3, STI regions 22 are recessed. The top portions of semiconductor strips 24 and dielectric dummy strip 25 protrude higher than the top surfaces 22A of the remaining portions of STI regions 22 to form protruding fins 24' and dummy fin 25', respectively. In accordance with some embodiments, protruding fins 24' may have heights in the range between about 40 nm and about 60 nm. The respective process is illustrated as process 206 in the process flow 200 as shown in FIG. 24. The etching may be performed using a dry etching process, wherein etching gases such as the mixture of HF and $NH_3$ may be used. In accordance with alternative embodiments of the present disclosure, the recessing of STI regions 22 is performed using a wet etching process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Further referring to FIG. 3, dummy gate stacks 30 and gate spacers 38 are formed on the top surfaces and the sidewalls of (protruding) fins 24' and dummy fin 25'. The respective process is illustrated as process 208 in the process flow 200 as shown in FIG. 24. Dummy gate stacks 30 may include dummy gate dielectrics 32 and dummy gate electrodes 34 over dummy gate dielectrics 32. Dummy gate electrodes 34 may be formed, for example, using polysilicon or amorphous silicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and dummy fins 25' and/or STI regions 22. Dummy gate stacks 30 also have lengthwise directions perpendicular to the lengthwise directions of protruding fins 24' and dummy fin 25'.

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. Gate spacers 38 may have widths in the range between about 1 nm and about 3 nm.

Figure 4:
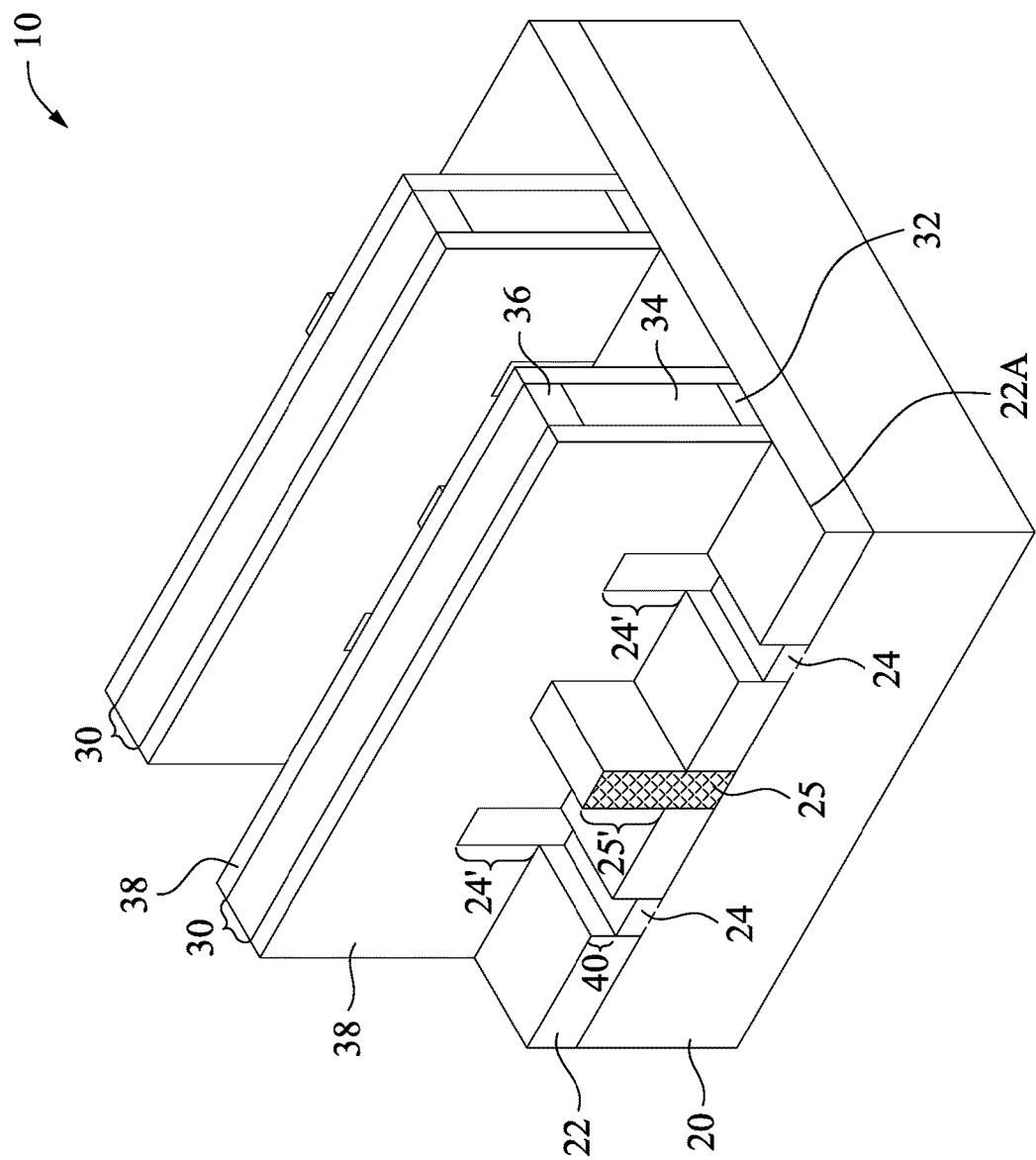

In accordance with some embodiments of the present disclosure, an etching process (referred to as source/drain recessing hereinafter) is performed to etch the portions of protruding fins 24' that are not covered by dummy gate stack 30 and gate spacers 38, resulting in the structure shown in FIG. 4. The respective process is illustrated as process 210 in the process flow 200 as shown in FIG. 24. The recessing may be anisotropic, and hence the portions of protruding fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched portions of protruding fins 24' are referred to as recesses 40. In the etching process, dielectric dummy fin 25' is not etched. For example, protruding fins 24' may be etched using the mixture of $NF_3$ and $NH_3$, the mixture of HF and $NH_3$, or the like.

Figure 5A:
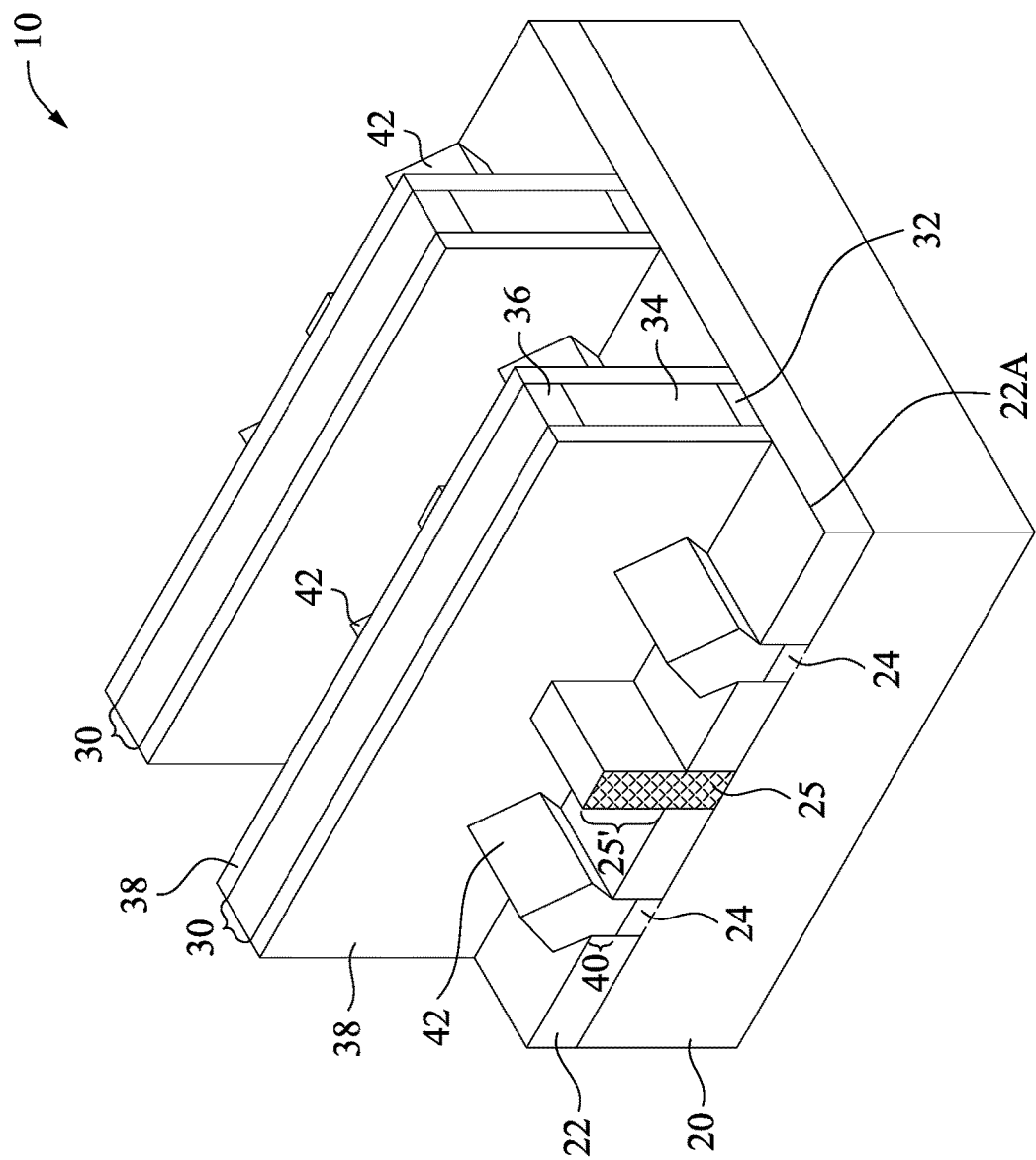

Next, epitaxy regions (source/drain regions) 42 are formed by selectively growing a semiconductor material from recesses 40, resulting in the structure in FIG. 5A. The respective process is illustrated as process 212 in the process flow 200 as shown in FIG. 24. In accordance with some embodiments, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), SiB, GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

Figure 5B:
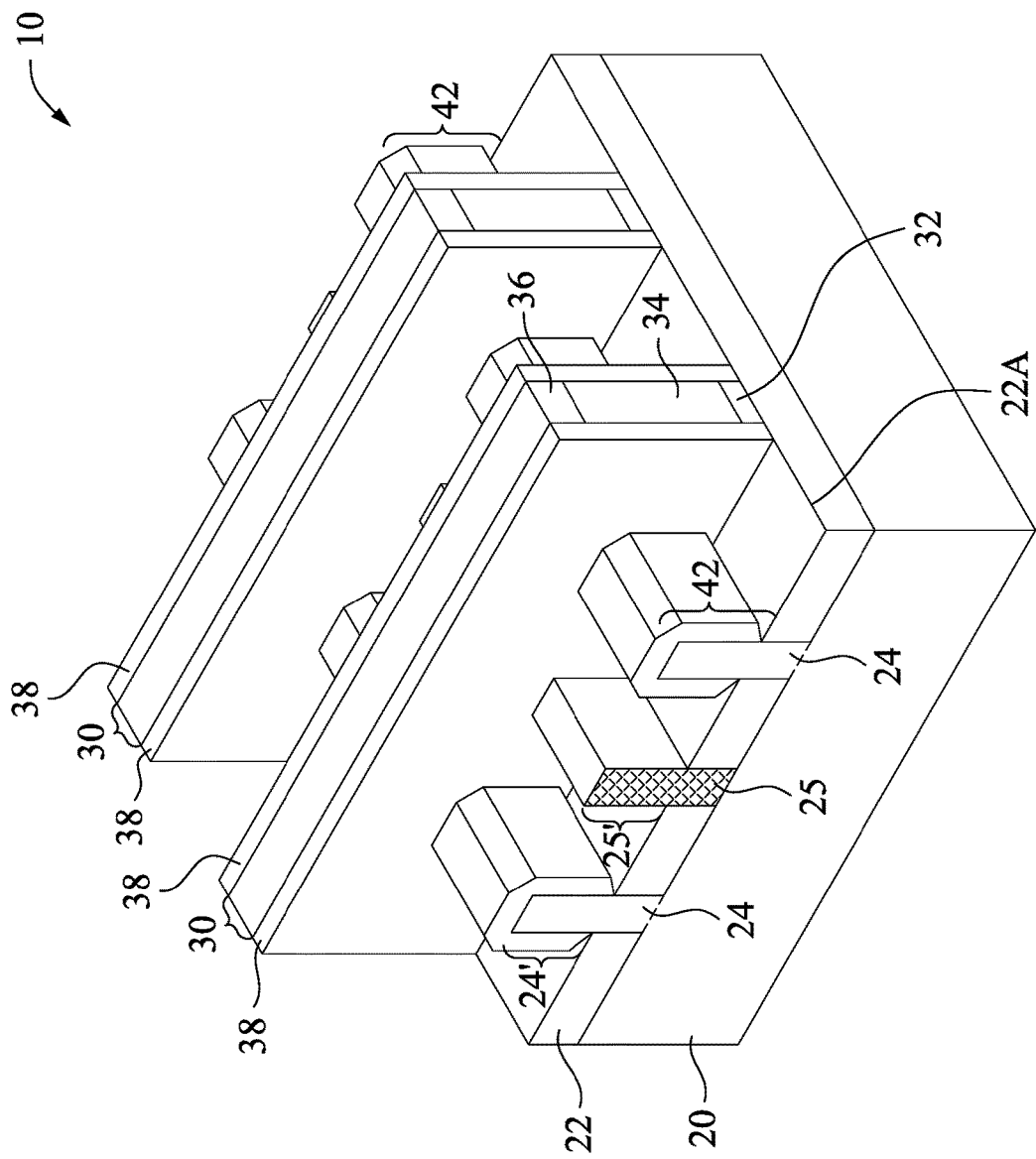

FIG. 5B illustrates the formation of source/drain regions 42 in accordance with alternative embodiments of the present disclosure. In accordance with these embodiments, the protruding fins 24' as shown in FIG. 4 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drain regions 42 include protruding fins 24' and the epitaxy regions 41. An implantation process may (or may not) be performed to implant an n-type impurity or a p-type impurity.

Figure 6:
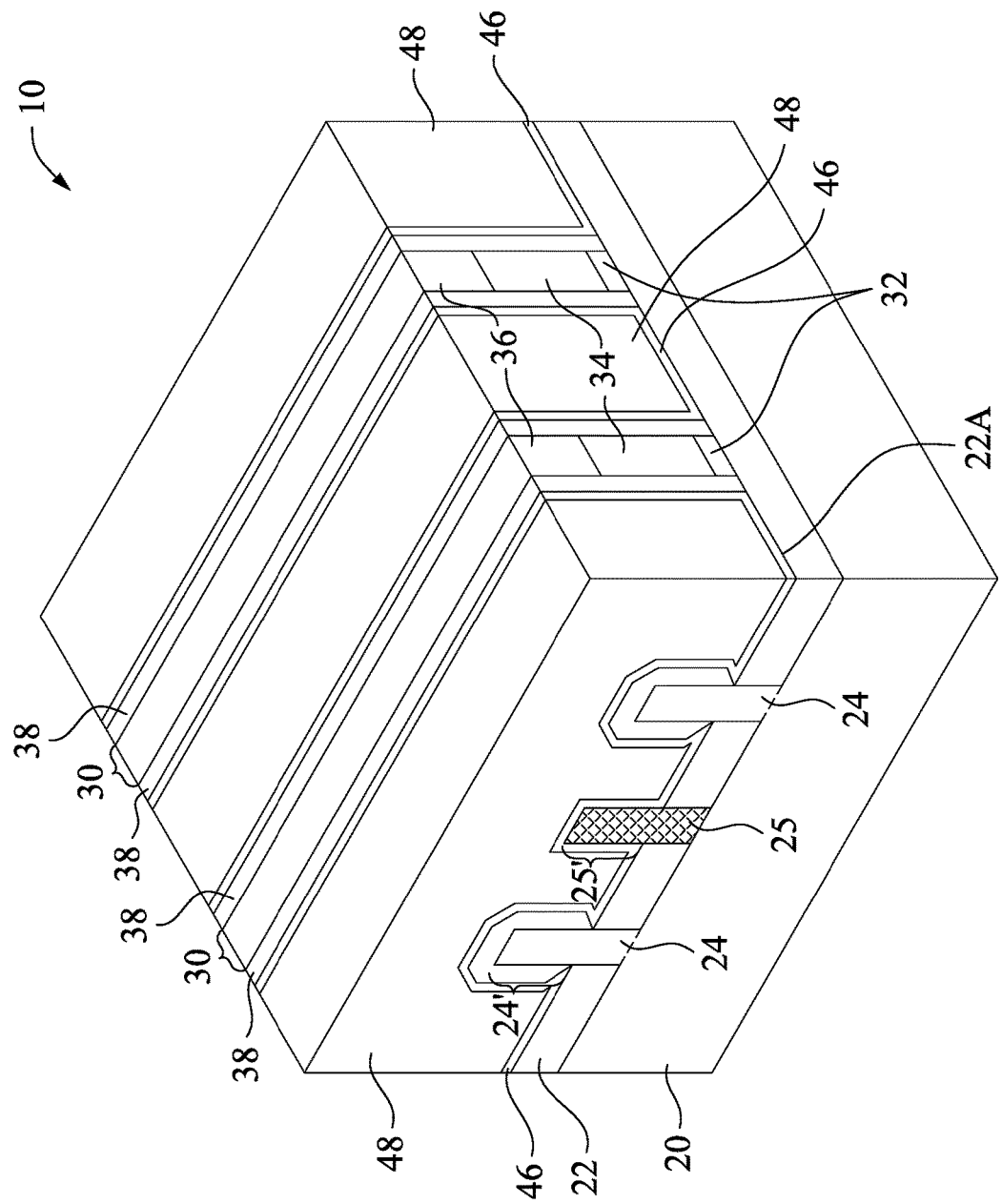

FIG. 6 illustrates a perspective view of the structure after the formation of Contact Etch Stop Layer (CESL) 46 and Inter-Layer Dielectric (ILD) 48. The respective process is illustrated as process 214 in the process flow 200 as shown in FIG. 24. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as silicon oxide, Phospho-Silicate Glass (PSG), Boro-Silicate Glass (BSG), Boron-Doped Phospho-Silicate Glass (BPSG), or the like. A planarization process such as Chemical Mechanical Polish (CMP) process or mechanical grinding process is performed to level the top surfaces of ILD 48, dummy gate stacks 30, and gate spacers 38 with each other. After the planarization, the top surfaces of dummy gate stacks 30 may be higher than the top surfaces of protruding fins by vertical distances in the range between about 75 nm and about 150 nm.

Figure 7A:
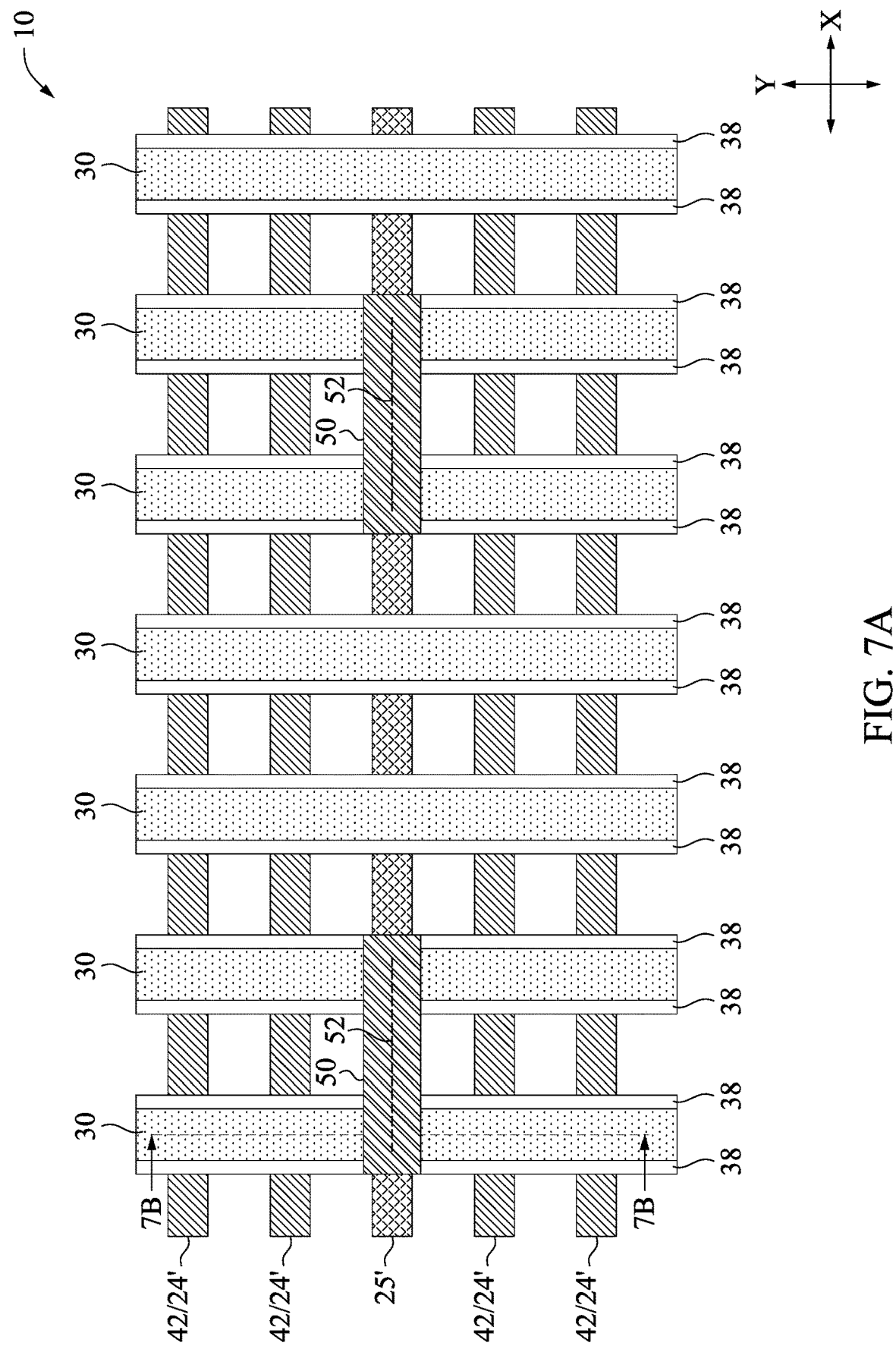

FIG. 7A illustrates a plane view (a top view) of a part of wafer 10, wherein protruding fins 24', dielectric dummy fin 25', dummy gate stacks 30, and gate spacers 38 are illustrated. Fin isolation regions 50, which are sometimes referred to as Cut-Poly (CPO) regions are formed. The respective process is illustrated as process 216 in the process flow 200 as shown in FIG. 24. The formation of Fin isolation regions 50 may be referred to as a CPO process. The protruding fins 24' may be directly underlying dummy gate stacks 30, and source/drain regions 42 are formed between dummy gate stacks 30. It is appreciated that the source/drain regions 42 grown from neighboring protruding fins 24' may be merged, which are not shown in FIG. 7A for clarity of the drawing. Protruding fins 24' are elongated strips having lengthwise directions in the X-direction. Dummy gate stacks 30 are formed as elongated strips having lengthwise directions in the Y-direction.

Figure 7B:
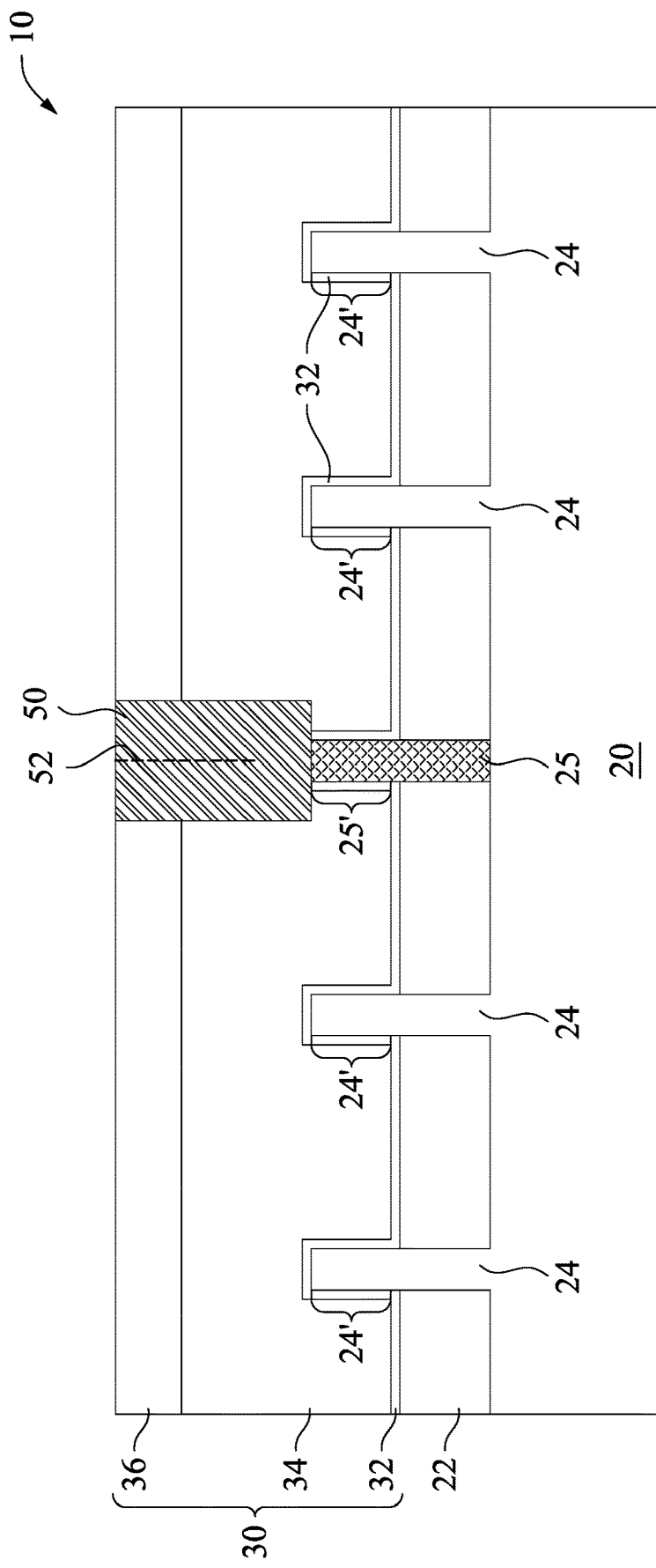

FIG. 7B illustrates a cross-sectional view obtained from reference cross-section 7B-7B in FIG. 7A. The horizontal portions of gate dielectric 32 are illustrated using dashed lines to indicate these portions may or may not exist. Gate isolation regions 50 are formed to separate the long dummy gate stacks 30 into shorter portions, so that the shorter dummy gate stacks 30 may act as the dummy gate stacks of different FinFETs. It is appreciated that in the illustrated example embodiments, gate isolation regions 50 are formed before replacement gate stacks are formed. In other embodiments, gate isolation regions 50 may also be formed after the formation of replacement gate stacks, and hence the replacement gate stacks (rather than dummy gate stacks) are cut by gate isolation regions 50. In accordance with some embodiments, the formation of gate isolation regions 50 includes forming an etching mask such as a patterned photo resist, wherein the regions in which gate isolation regions 50 (FIG. 7A) are to be formed are revealed through the openings in the etching mask. The openings in the etching mask are directly over some portions of dummy fin 25'. The portions of dummy gate stacks 30 revealed through the etching mask are then etched. The etching may be stopped after dummy fin 25' is revealed, as may be perceived from FIG. 7B. Next, the etching mask is removed, and a dielectric material is deposited to fill the openings in dummy gate stacks 30 to form gate isolation regions 50.

In accordance with some embodiments, the deposition of the dielectric material is performed using a conformal deposition method such as Atomic Layer Deposition (ALD), which may be Plasma-Enhance ALD (PEALD), thermal ALD, or the like. The dielectric material may be formed of or comprise SiN, SiO$_2$, SiOC, SiOCN, or the like, or combinations thereof. After the deposition process, a planarization process such as a CMP process or a mechanical grinding process is performed. The remaining portions of the dielectric material are gate isolation regions 50. Seams 52 may be, or may not be, formed in the middle of gate isolation regions, as shown in FIGS. 7A and 7B. Seams 52 are illustrated using dashed lines to indicate they may or may not exist.

Figure 8A:
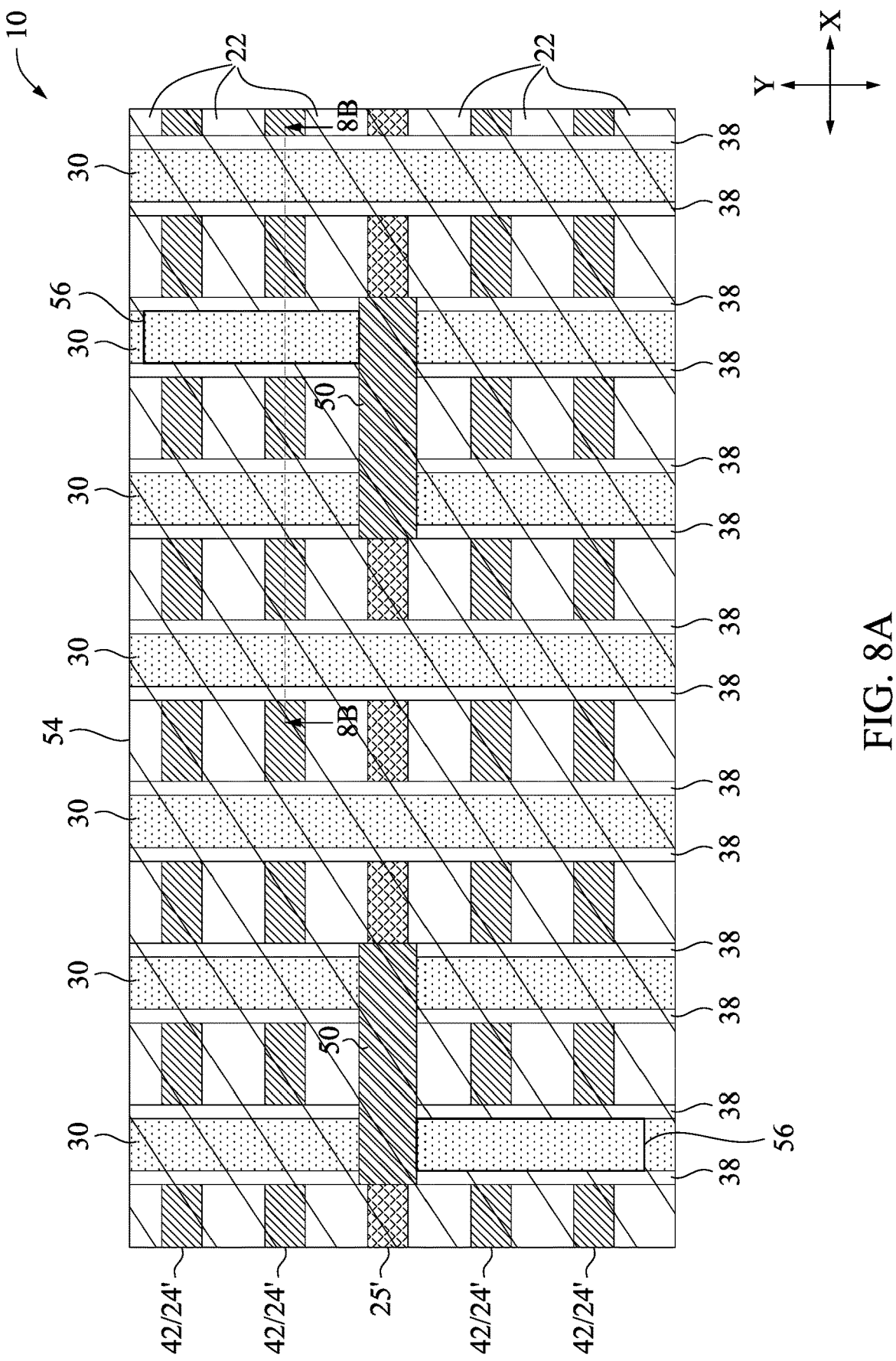
Figure 16:
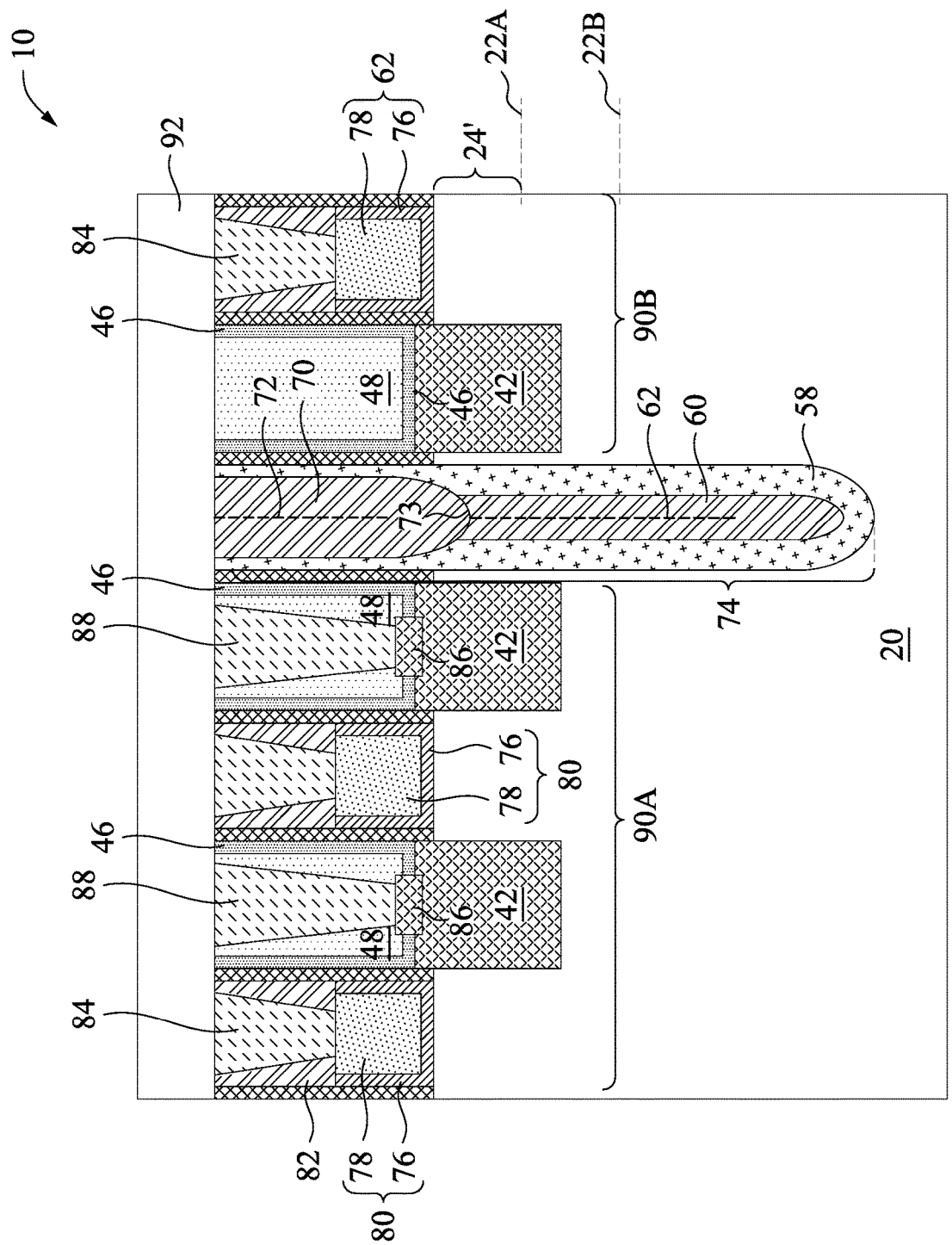

FIG. 8A illustrates a plane view (top view) in the formation of etching mask 54, which is formed and used for defining the patterns of fin isolation regions 74 (FIG. 16, sometimes referred to as Cut-Poly on OD Edge (CPODE) regions). The respective process is illustrated as process 218 in the process flow 200 as shown in FIG. 24. The respective process may also be referred to as a CPODE process. Fin isolation regions 74 will separate the long protruding fins 24' into shorter portions, so that the shorter protruding fins 24' may act as the active regions (such as channels) of different FinFETs. As shown in FIG. 8A, etching mask 54 covers wafer 10, with openings 56 formed to expose some portions of dummy gate stacks.

Figure 8B:
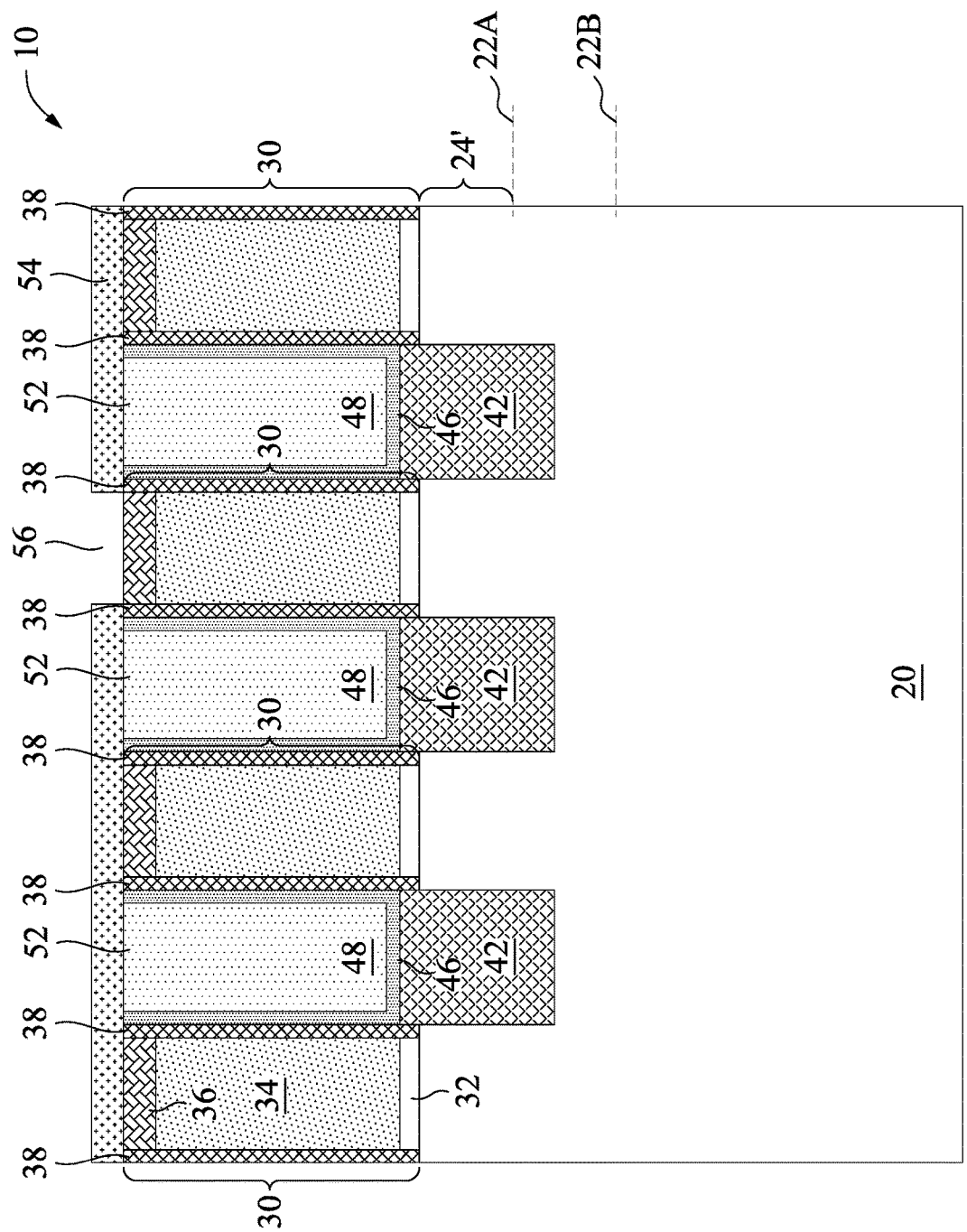

FIG. 8B illustrates a cross-sectional view obtained from reference cross-section 8B-8B in FIG. 8A. The illustrated opening 56 in etching mask 54 is directly over dummy gate stack 30. In accordance with some embodiments, etching mask 54 is formed of a materials that is different from the materials of dummy gate stack 30, and may be formed of, for example, TiN, BN, TaN, or the like. Etching mask 54 may be formed by depositing a blanket layer, forming and patterning a photo resist, and then using the patterned photo resist as an etching mask to etch and pattern etching mask 54, forming openings 56 as shown in FIGS. 8A and 8B. Etching mask 54 may have a thickness in the range between about 20 nm and about 50 nm.

Figure 9:
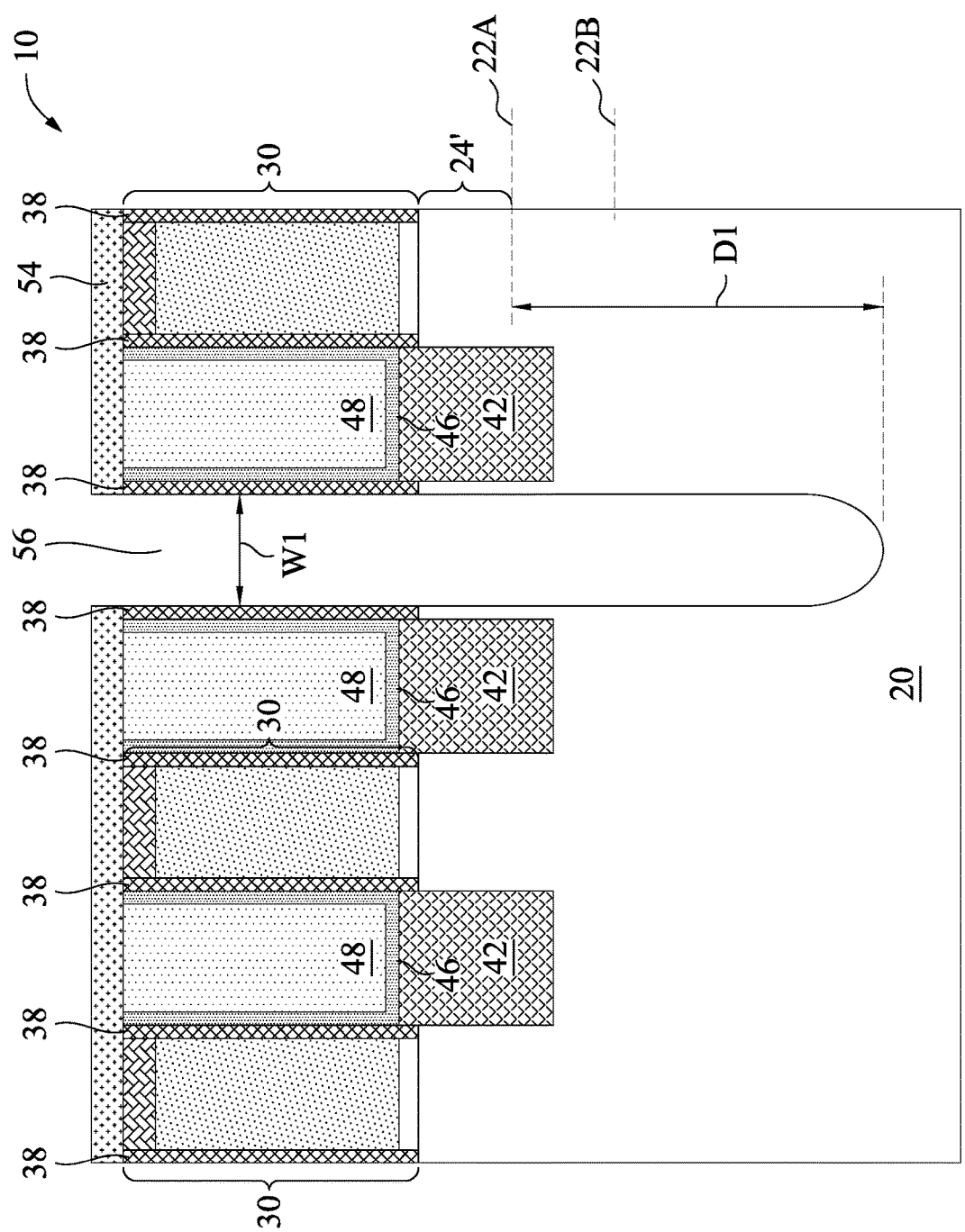

Next, the exposed dummy gate stack 30 is etched through opening 56, resulting in opening 56 to extend between gate spacers 38. The resulting structure is shown in FIG. 9. The respective process is illustrated as process 220 in the process flow 200 as shown in FIG. 24. The underlying protruding fins 24' are thus exposed. The protruding fins 24' are then etched anisotropically, and the etching continues down into the underlying semiconductor strips 24, and further into the underlying bulk portions of semiconductor substrate 20. STI regions 22 act as parts of the etching mask to define the patterns of the resulting openings (FIG. 8A, which shows that openings 56 have some portions directly over STI regions 22 between protruding fins 24'). In accordance with some embodiments, opening 56 has width W1 in the range between about 12 nm and about 24 nm, wherein width W1 may be measured at a middle height of dummy gate stacks 30. Opening 56 extends lower than the bottoms of source/drain regions 42. Furthermore, opening 56 may extend lower than the bottom of protruding fins 24', for example, by depth D1, which may be in the range between about 50 nm and about 200 nm.

Figure 10:
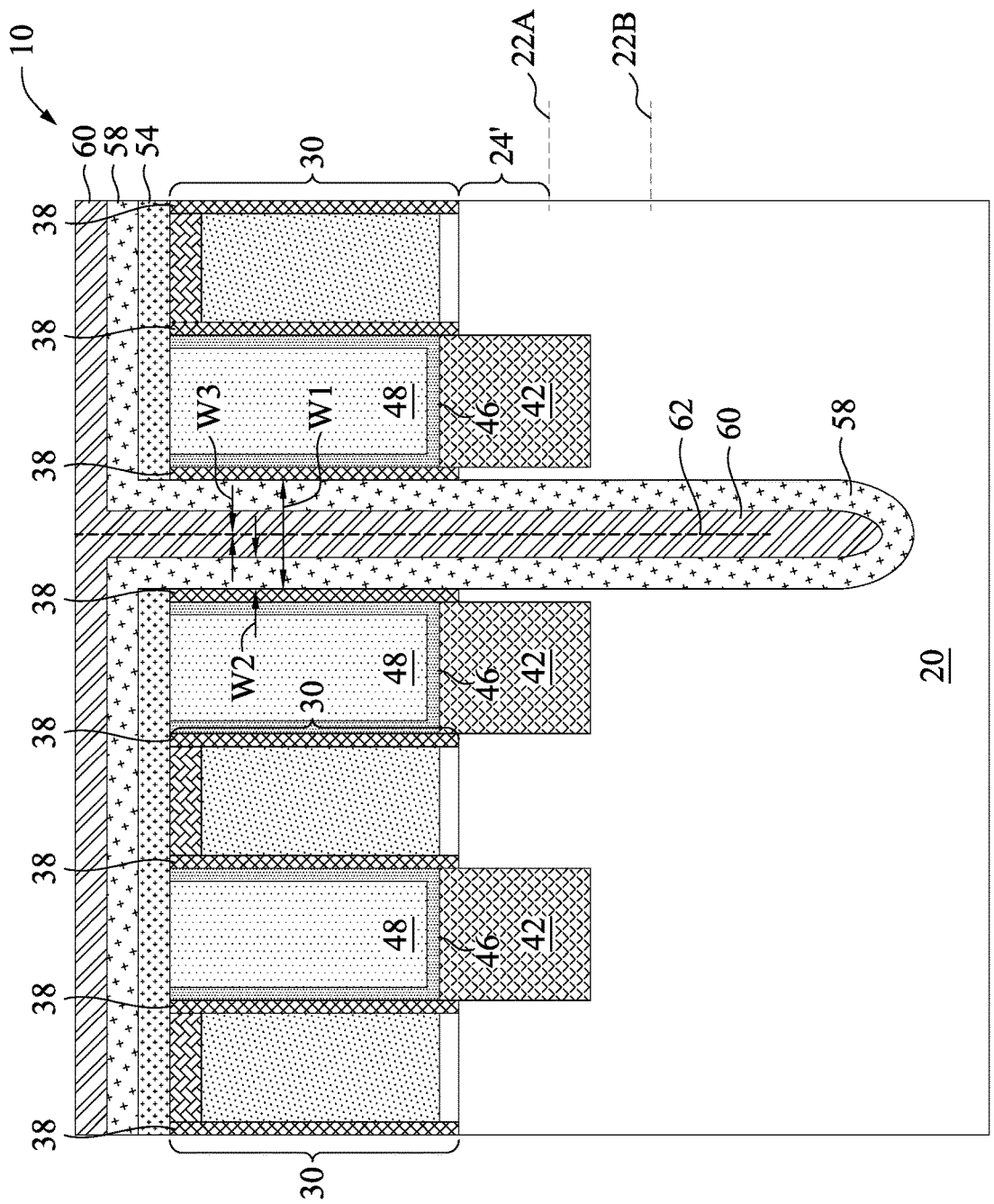

FIG. 10 illustrates the deposition of a first dielectric layer 58 and a second dielectric layer 60. The respective process is illustrated as process 222 in the process flow 200 as shown in FIG. 24. The first dielectric layer 58 and the second dielectric layer 60 are different from each other. In accordance with some embodiments, the first dielectric layer 58 has a high bandgap BG58 to reduce leakage current. The first bandgap BG58 is higher than a second bandgap BG60 of the second dielectric layer 60. Furthermore, the bandgap difference (BG58−BG60) may be greater than about 2.0 eV, and may be greater than about 3.0 eV. The bandgap difference (BG58−BG60) may also be in the range between about 2.0 eV and about 5.0 eV. On the other hand, the second dielectric layer 60 is selected to have better etching resistance to the etching chemical used in the subsequent etching process, for example, for forming contacting openings. The etching chemical may include carbon-and-fluorine based gases such as $CF_4$, $CHF_3$, or the like. An example first dielectric layer 58 is silicon oxide ($SiO_2$), which has the bandgap of about 9 eV, and an example second dielectric layer 60 is silicon nitride ($Si_3N_4$), which has the bandgap of about 5 eV.

The deposition of first dielectric layer 58 and second dielectric layer 60 may include conformal deposition processes such as ALD (Plasma Enhance ALD (PEALD) or thermal ALD), CVD, or the like, so that the resulting first dielectric layer 58 and second dielectric layer 60 are conformal layers, for example, with thickness variation of different parts being smaller than about 10 percent. In accordance with some embodiments in which the first dielectric layer 58 comprises $SiO_2$, the deposition is performed using process gases including Silanediamine or N,N,N',N'-tetraethyl ($C8H_{22}N_2Si$) and oxygen ($O_2$). The deposition process may be performed using PEALD at a temperature in a range between about 200° C. and about 300° C. The thickness (width) W2 of the first dielectric layer 58 may be in the range between about ⅕ and about ⅖ of width W1 of opening 56. Thickness W2 may also be measured at the middle height of dummy gate stacks 30. In accordance with some embodiments, width W2 is between about 2 nm and about 8 nm.

In accordance with some embodiments, the second dielectric layer 60 is formed of or comprises SiN, and the deposition is performed using process gases including dichlorosilane ($SiH_2Cl_2$) and ammonia ($NH_3$). Hydrogen ($H_2$) may also be added. The deposition process may be performed using PEALD at a temperature in a range between about 450° C. and about 650° C. The deposition process may be performed using PEALD at a temperature in a range between about 350° C. and about 550° C. After the deposition process, a planarization process such as a CMP process or a mechanical grinding process may be performed to level the top surface of first dielectric layer 58 and second dielectric layer 60. Seam 62 may be formed in second dielectric layer 60. Seam 62 may have a width W3 in a range between about 0.5 nm and about 2 nm.

Figure 11:
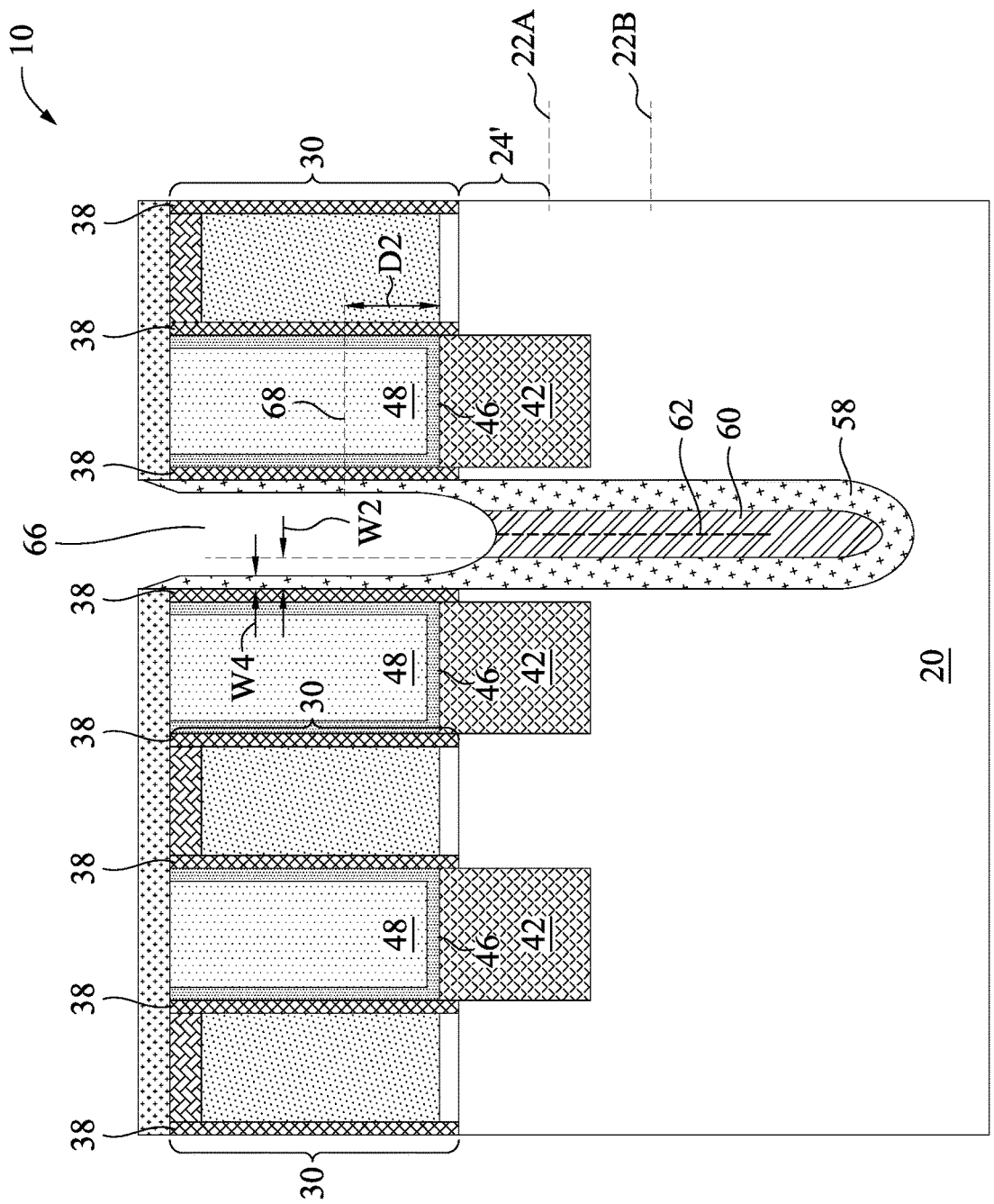

Referring to FIG. 11, the second dielectric layer 60 and the first dielectric 58 are recessed in an etching process, which may be a wet etching process or a dry etching process. The respective process is illustrated as process 224 in the process flow 200 as shown in FIG. 24. The etching chemical is selected so that the etching rate ER58 of the first dielectric layer 58 is lower than etching rate ER60 of the second dielectric layer 60. The ratio ER60/ER58 may also be greater than about 50, and may be in the range between about 90 and about 100. In accordance with some embodiments, the etching is performed through a wet etching process, in which $H_3PO_4$ is used. As a result of the etching process, opening 66 is formed. The portions of first dielectric layer 58 on opposing sides of opening 66 are thinned compared to before the etching process. For example, at a middle height of dummy gate stacks 30, which middle height is in the middle of the top surfaces and the bottom surfaces of dummy gate stacks 30, the thickness of the first dielectric layer 58 may be reduced from W2 to W4, with ratio W4/W2 being smaller than about 0.5, and ratio W4/W2 may be in the range between about 0.1 and about 0.5.

In accordance with some embodiments, the bottom of opening 66 is at a controlled level, for example, at a level lower than dashed line 68, wherein the vertical distance D2 of dashed line 68 from the top surface of protruding fin 24' is smaller than about 50 nm, or smaller than about 20 nm. The bottom of recess 66 may also be at any level between dashed line 68 and the top surfaces 22A of STI regions 22, or at any level between the top surfaces 22A and the bottom surfaces 22B of STI regions 22.

Figure 12:
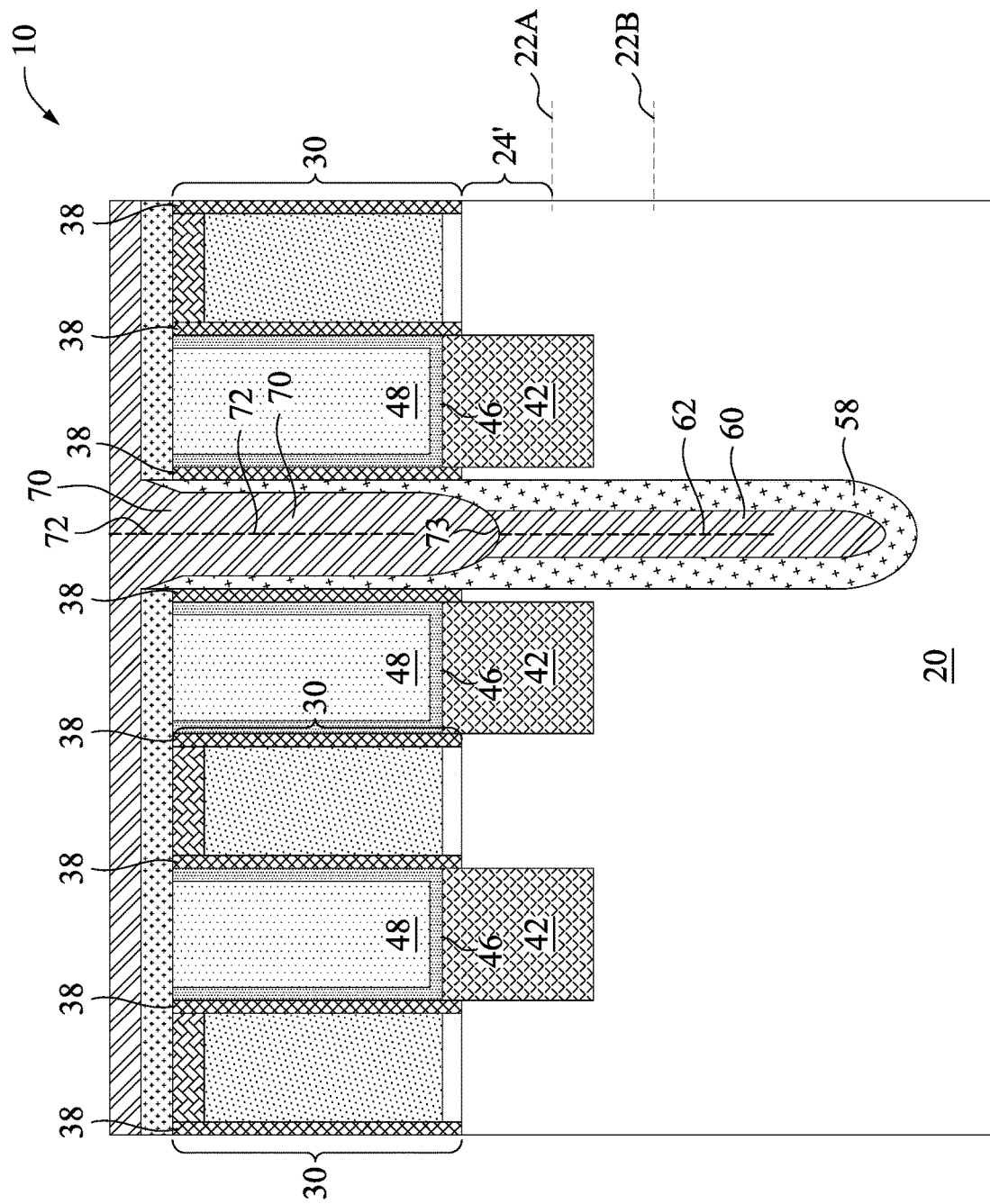

Referring to FIG. 12, a third dielectric layer 70 is deposited to fill opening 66. The respective process is illustrated as process 226 in the process flow 200 as shown in FIG. 24. In accordance with some embodiments, the third dielectric layer 70 is the same as or different from (but may be similar to) the second dielectric layer 60. The property of the third dielectric layer 70 is the same or similar to the property of the second dielectric layer 60. For example, the etching rate ER70 of the third dielectric layer 70, when subject to etching in subsequent processes (for example, in the formation of contact openings), may be smaller than, equal to, or slightly greater than the etching rate ER60 of the second dielectric layer 60. For example, an absolute value of (ER70−ER60)/ER60 may be smaller than about 0.2 or smaller than about 0.1. An example third dielectric layer 70 is formed of or comprises silicon nitride ($Si_3N_4$), which has the bandgap of about 9 eV. The deposition process may be selected from the candidate deposition processes for depositing the second dielectric layer 60.

Figure 13:
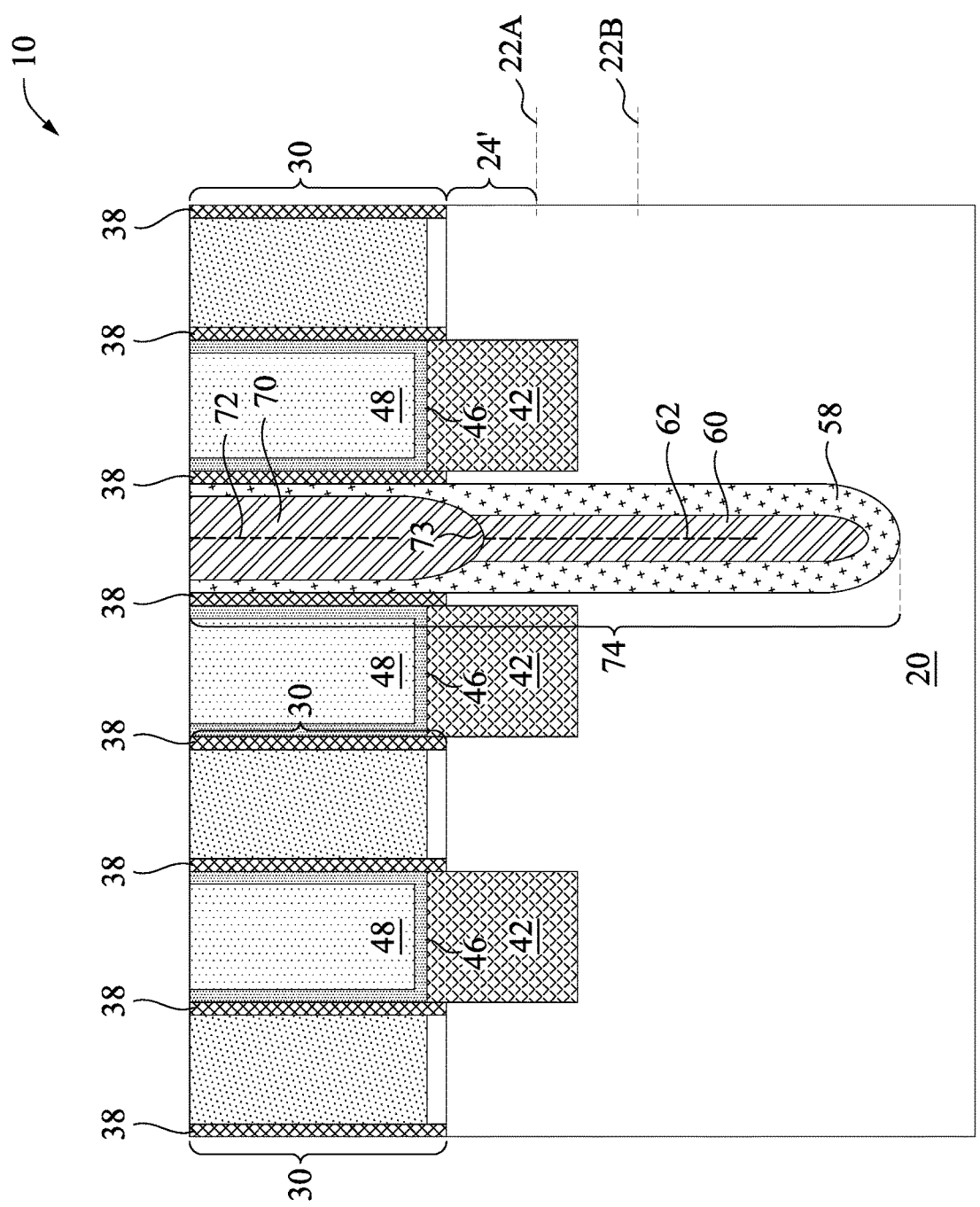

Next, as shown in FIG. 13, a planarization process is performed to remove excess portions of the third dielectric layer 70 and the first dielectric layer 58. The respective process is illustrated as process 228 in the process flow 200 as shown in FIG. 24. In accordance with some embodiments, the planarization process is performed using dummy gate electrodes 34 as a stop layer. In accordance with alternative embodiments, the planarization process is performed using hard masks 36 as a stop layer. Fin isolation region 74 is thus formed, which includes first dielectric layer 58, second dielectric layer 60, and third dielectric layer 70.

In the second dielectric layer 60, there may be, or may not be, seam 62 formed. In the third dielectric layer 70, there may be, or may not be, seam 72 formed. In accordance with some embodiments, the seams 62 and 72 may have widths in the range between about 0.5 nm and about 2 nm. The material of dielectric layer 70 is different from the material of dielectric layer 58, and may be the same as, or different from, the material of the second dielectric layer 60. The interface 73 between dielectric layer 70 and the underlying dielectric layer 60 may be distinguishable (for example, in a Transmission electron microscopy (TEM image)), regardless of whether dielectric layers 60 and 70 are formed of the same material or different materials. For example, when the second dielectric layer 60 and the third dielectric layer 70 are both formed of SiN, the surface layer of dielectric layer 60 may be oxidized in natural oxidation to form a thin SiON interface layer, which is also denoted as 73.

As shown in FIG. 13, the bottom portion of dielectric layer 70 separates the overlying seam 72 from the underlying seam 62. Seam 72 may overlap (vertically aligned to) seam 62 if both of seams 62 and 72 are formed. In accordance with alternative embodiments, either one, but not both, of seams 62 and 72 may be formed. In accordance with yet alternative embodiments, neither of seams 62 and 72 is formed.

Figure 14:
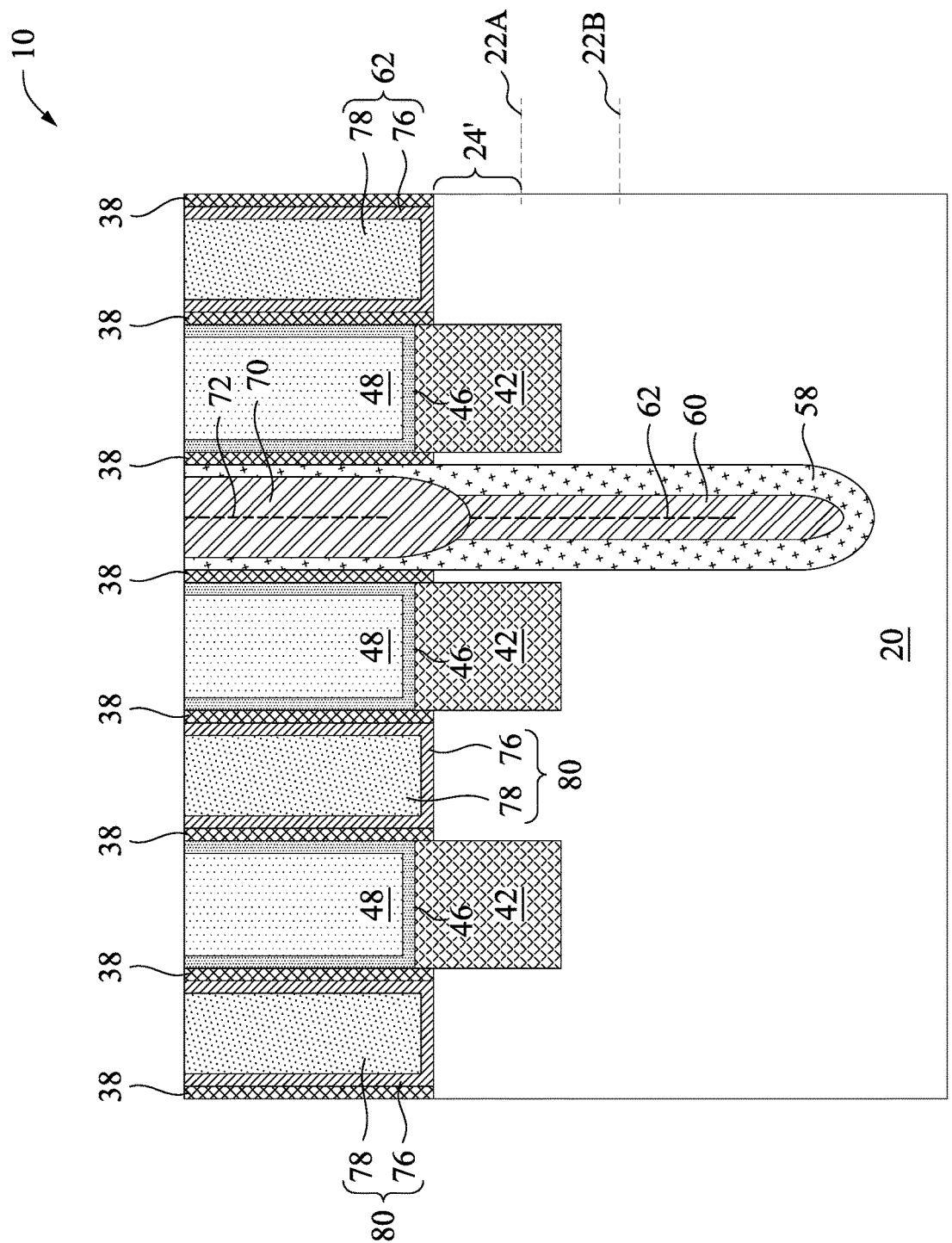

FIG. 14 illustrates the formation of replacement gate stacks 80. The respective process is illustrated as process 230 in the process flow 200 as shown in FIG. 24. The dummy gate stacks 30 as shown in FIG. 13 are removed through etching, and trenches are formed. Next, as shown in FIG. 14, (replacement) gate stacks 80 are formed, which include gate dielectric layers 76 and gate electrodes 78. The formation of gate stacks 80 includes forming/depositing a plurality of layers, and then performing a planarization process such as a CMP process or a mechanical grinding process. In accordance with some embodiments of the present disclosure, each of gate dielectric layers 76 includes an Interfacial Layer (IL) as its lower part. The IL is formed on the exposed surfaces of protruding fins 24'. The IL may include an oxide layer such as a silicon oxide layer, which is formed through the thermal oxidation of protruding fins 24', a chemical oxidation process, or a deposition process. Each of gate dielectric layers 76 may also include a high-k dielectric layer formed over the IL. The high-k dielectric layer may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. The high-k dielectric layer may be formed as conformal layers, and extends on the sidewalls of protruding fins 24' and the sidewalls of gate spacers 38. Gate dielectric layers 76 also extend on the top surfaces and the sidewalls of some portions of dielectric dummy fin 25', except there may not be IL formed on dielectric dummy fin 25' if IL is formed through thermal oxidation. In accordance with some embodiments of the present disclosure, the high-k dielectric layers in gate dielectric layers 76 are formed using ALD, CVD, or the like.

Gate electrodes 78 are formed on top of gate dielectric layers 76, and fill the remaining portions of the trenches left by the removed dummy gate stacks. The sub-layers in gate electrodes 78 are not shown separately, while the sub-layers may be distinguishable from each other due to the difference in their compositions. The deposition of at least lower sub-layers may be performed using conformal deposition methods such as ALD or CVD.

The sub-layers in gate electrodes 78 may include, and are not limited to, a Titanium Silicon Nitride (TiSN) layer, a tantalum nitride (TaN) layer, a titanium nitride (TiN) layer, a titanium aluminum (TiAl) layer, an additional TiN and/or TaN layer, and a filling metal region. Gate electrodes 78 are referred to as metal gates 78 hereinafter. Some of these sub-layers define the work function of the respective Fin-FET. Furthermore, the metal layers of a p-type FinFET and the metal layers of an n-type FinFET may be different from each other so that the work functions of the metal layers are suitable for the respective p-type or n-type FinFETs. The filling metal may include tungsten, cobalt, or the like.

Figure 15:
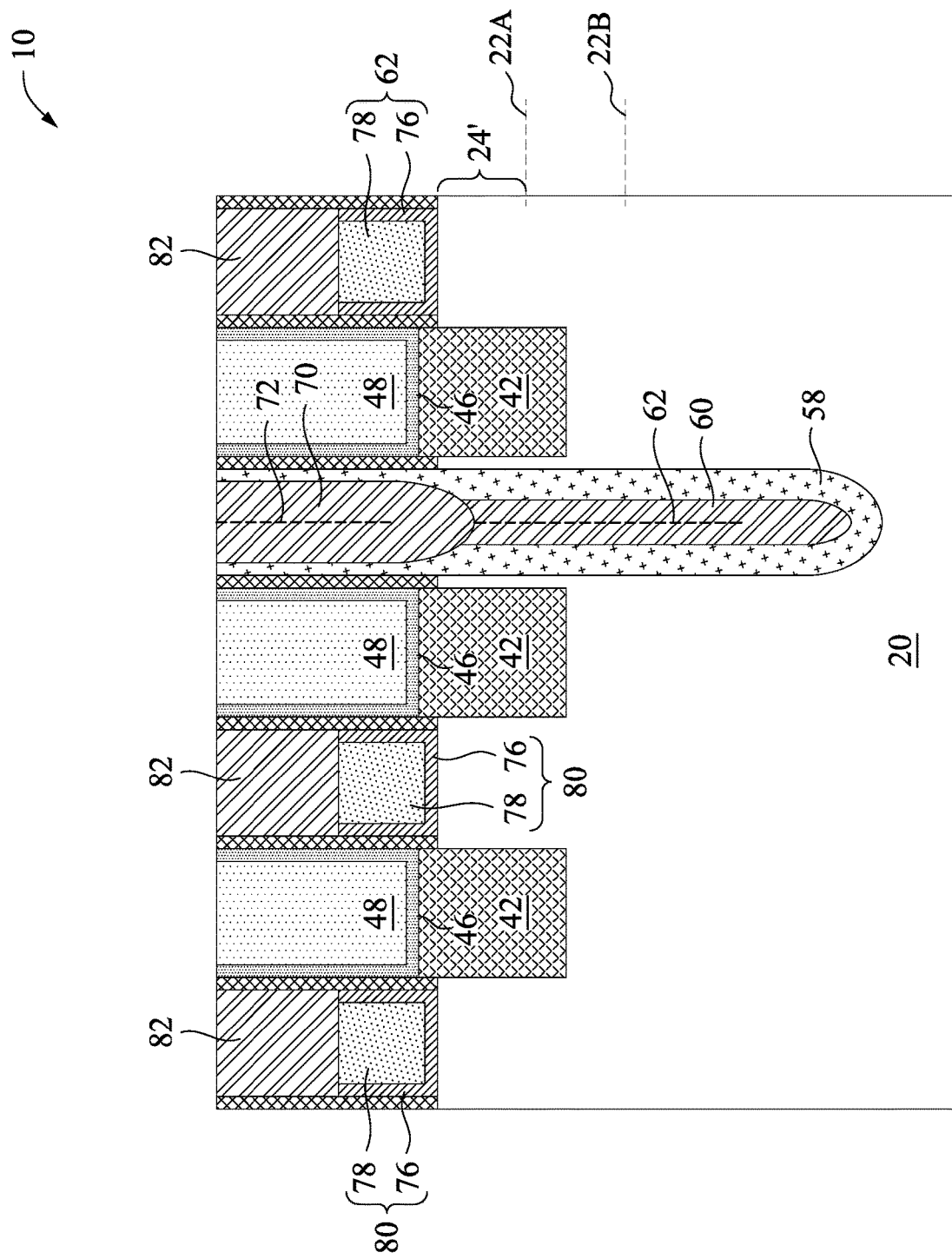

FIG. 15 illustrates the formation of dielectric hard masks 82, which are sometimes referred to as Self-Aligned Contact (SAC) fill layers 82. The respective process is illustrated as process 232 in the process flow 200 as shown in FIG. 24. The formation process may include recessing replacement gate stacks 80, for example, through etching processes, filling a dielectric material, and performing a planarization process to remove excess portions of the dielectric material. Dielectric hard masks 82 may be formed of or comprise SiN, $SiO_2$, SiOC, SiOCN, or the like, or combinations thereof.

FIG. 16 illustrates the formation of additional features for FinFETs. The respective process is illustrated as process 234 in the process flow 200 as shown in FIG. 24. For example, gate contact plugs 84 are formed over and contacting gate electrodes 60. Source/drain silicide regions 86 and source/drain contact plugs 88 are also formed to electrically connect to the source/drain regions 42. FinFETs 90A and 90B are thus formed. Dielectric layer 92 is then deposited, which may seal the top end of seam 72. Dielectric layer 92 may include an ILD, an etch stop layer, and/or the like.

It is appreciated that the processes as shown in FIGS. 11 through 16 results in the exposed surface of the first dielectric layer 58 to be narrowed. As can be perceived from FIG. 16, the formation of gate contact plug 84 and source/drain contact plugs 88 may include etching dielectric hard masks 82, ILD 48, and CESL 46. In these etching processes, the top surfaces of the third dielectric layer 70 and the first dielectric layer 58 are exposed to the etching chemicals. Since the third dielectric layer 70 is more resistant to the etching chemical and the first dielectric layer 58 is less resistant to the etching chemical, thinning the first dielectric layer 58 may reduce the etching rate of the first dielectric layer 58, and the resulting void caused by the etching is reduced.

Figure 23:
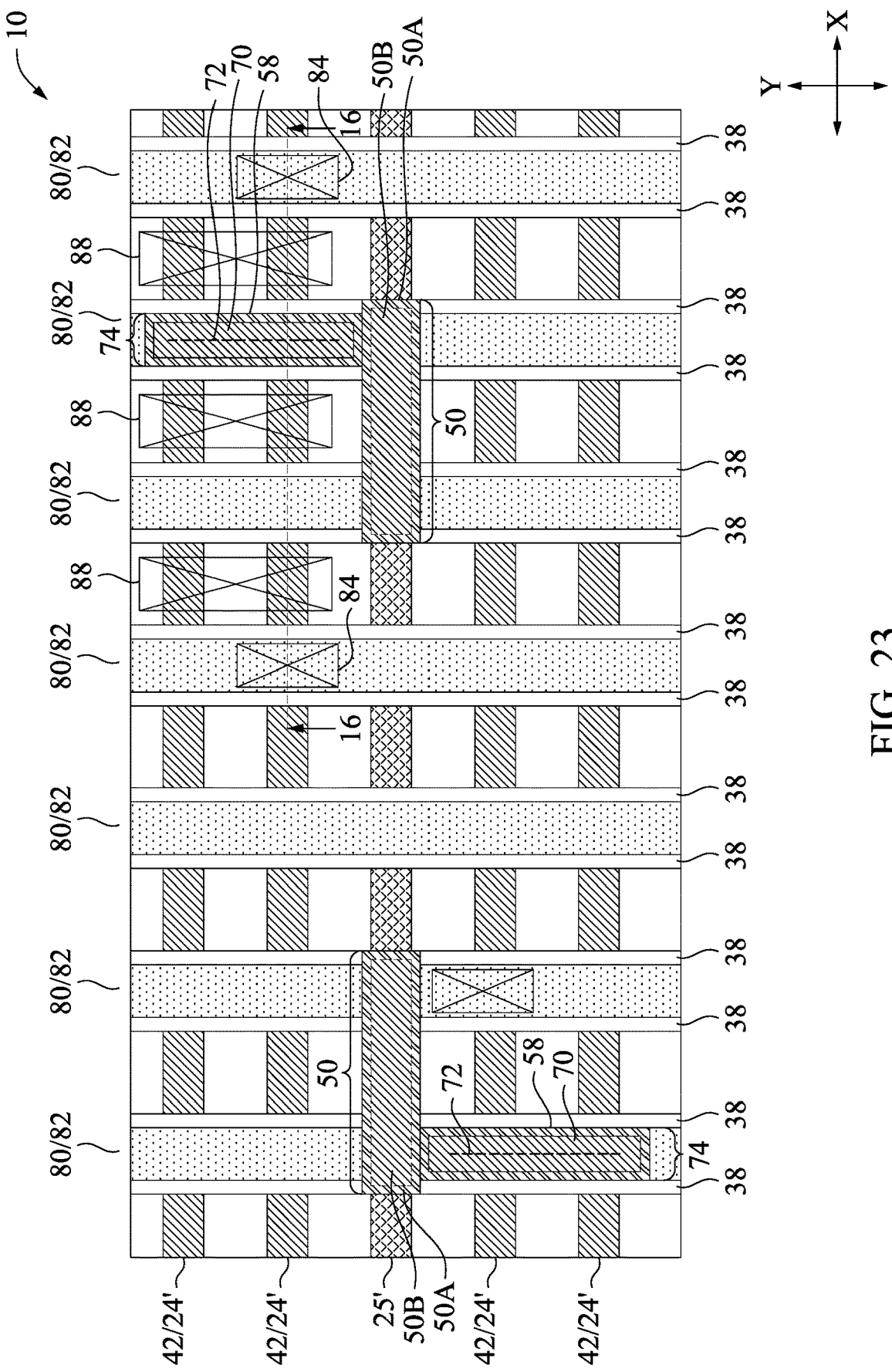
FIG. 23 illustrates a top view of a device region in accordance with some embodiments.

FIG. 23 illustrates a top view of a portion of wafer 10 in accordance with some embodiments. The cross-sectional view shown in FIG. 16 is obtained from cross-section 16-16 in FIG. 23. In FIG. 23, some gate contact plug 84 and source/drain contact plugs 88 are illustrated, while there may be more formed. Fin isolation regions 74 as shown in FIG. 16 are illustrated. In accordance with some embodiments, at the time the fin isolation regions 74 are formed through deposition-recessing-deposition, as shown in FIGS. 10 through 12, the recessing and deposition may simultaneously performed on gate isolation regions 50, so that the top portions of gate isolation regions 50 may be re-formed to include layers 50A and 50B. The bottom portions of gate isolation regions 50, however, may remain not replaced. Layers 50A may be formed of a material same as or similar to that of dielectric layers 58, and layers 50B may be formed of the same material as that of dielectric layers 70. In accordance with alternative embodiments, gate isolation regions 50 are protected from the recessing and re-deposition, and hence may be formed of a homogeneous material.

FIGS. 17 through 22 illustrate the cross-sectional views of intermediate stages in the formation of fin isolation regions 74 and FinFETs in accordance with alternative embodiments of the present disclosure. These embodiments are similar to the preceding embodiments, except that there is no second dielectric layer 60 (for example, refer to FIG. 10) deposited. Unless specified otherwise, the materials and the formation processes of the components in these embodiments are essentially the same as the like components, which are denoted by like reference numerals in the preceding embodiments. The details regarding the formation process and the materials of the components shown in FIGS. 17 through 22 may thus be found in the discussion of the preceding embodiments.

Figure 17:
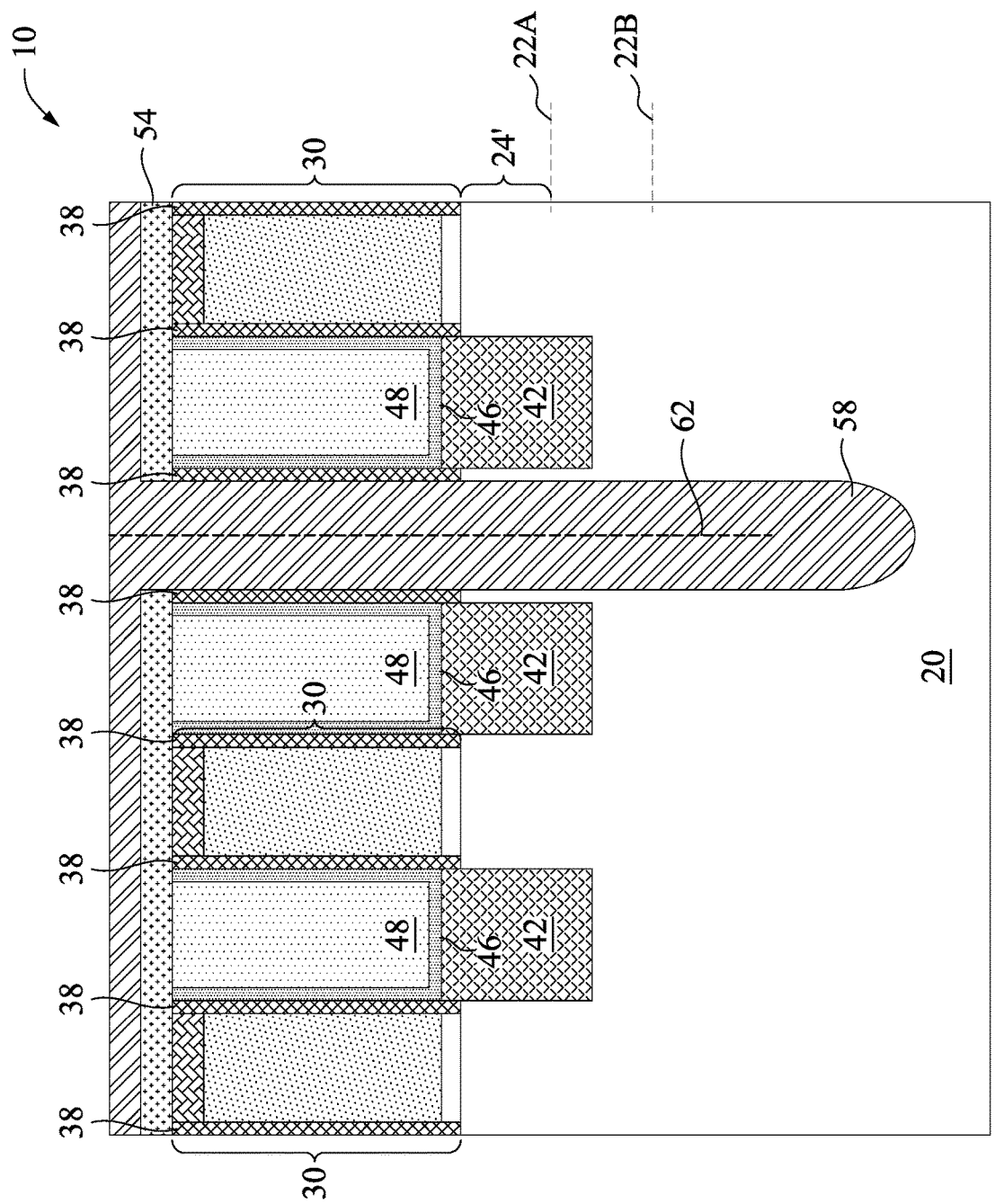
FIGS. 17-22 illustrate the cross-sectional views in the formation of isolation regions in accordance with some embodiments.

The initial steps of these embodiments are essentially the same as shown in FIGS. 1-4, 5A, 5B, 6, 7A, 7B, 8A, 8B, and 9. Next, as shown in FIG. 17, dielectric layer 58 is deposited. The material and the deposition process are essentially the same as discussed referring to FIG. 10, and are not repeated herein. Dielectric layer 58 fills the opening 56 as shown in FIG. 9. Seam 62 may be, or may not be formed in dielectric layer 58.

Figure 18:
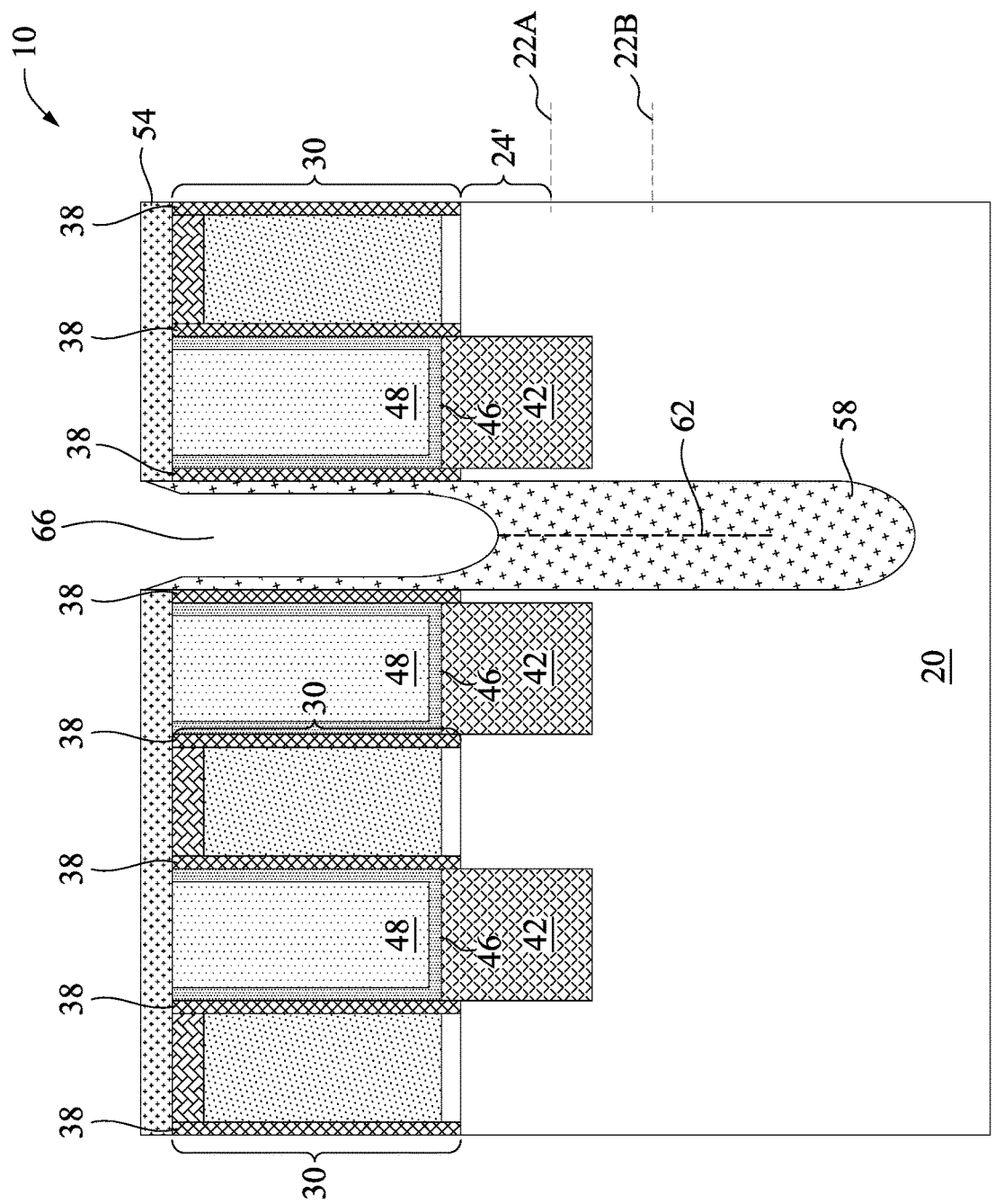

Referring to FIG. 18, an etching process is performed to etch dielectric layer 58, so that opening 66 is formed. The etching has a high degree of anisotropic (directional) effect. In accordance with some embodiments, the etching is fully anisotropic. In accordance with alternative embodiments, the etching includes isotropic etching effect and anisotropic etching effect, with the anisotropic etching rate being greater than the isotropic etching rate. The vertical etching rate ERV is greater than the horizontal etching rate ERH, for example, with ratio ERV/ERH being greater than 1, in the range between about 1 and about 5, or greater than about 5. In accordance with some embodiments, the etching gas may include a carbon-and-fluorine based gas including, and not limited to, $CF_4$, $CHF_3$, $CH_2F_2$, $CH_3F$, or the combinations thereof. Bias power may be adjusted to adjust the anisotropic etching rate and the isotropic etching rate. As a result of the etching process, opening 66 is formed. The bottom position of opening 66 is as discussed in preceding embodiments, and is not repeated herein.

Figure 19:
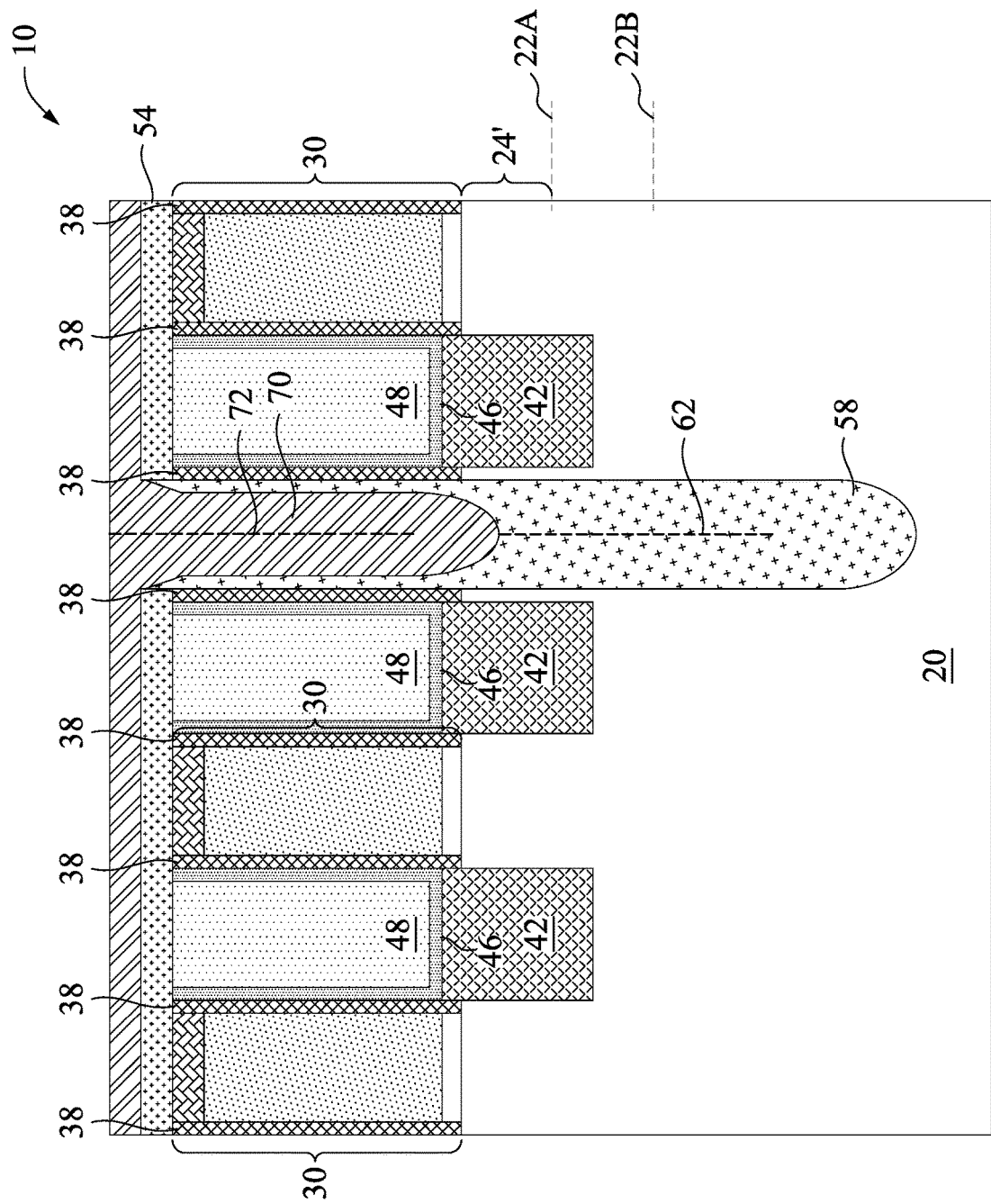
Figure 20:
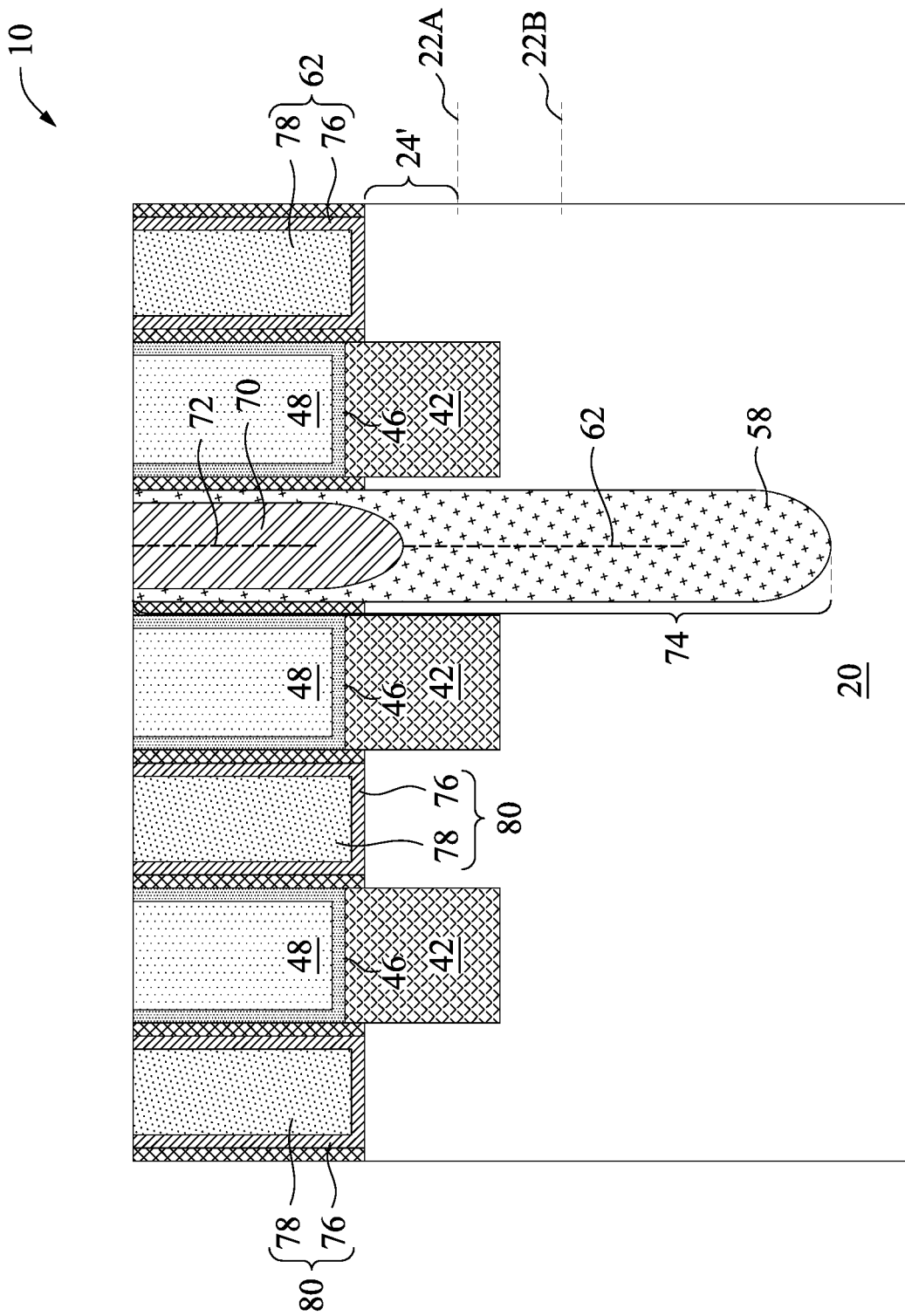
Figure 21:
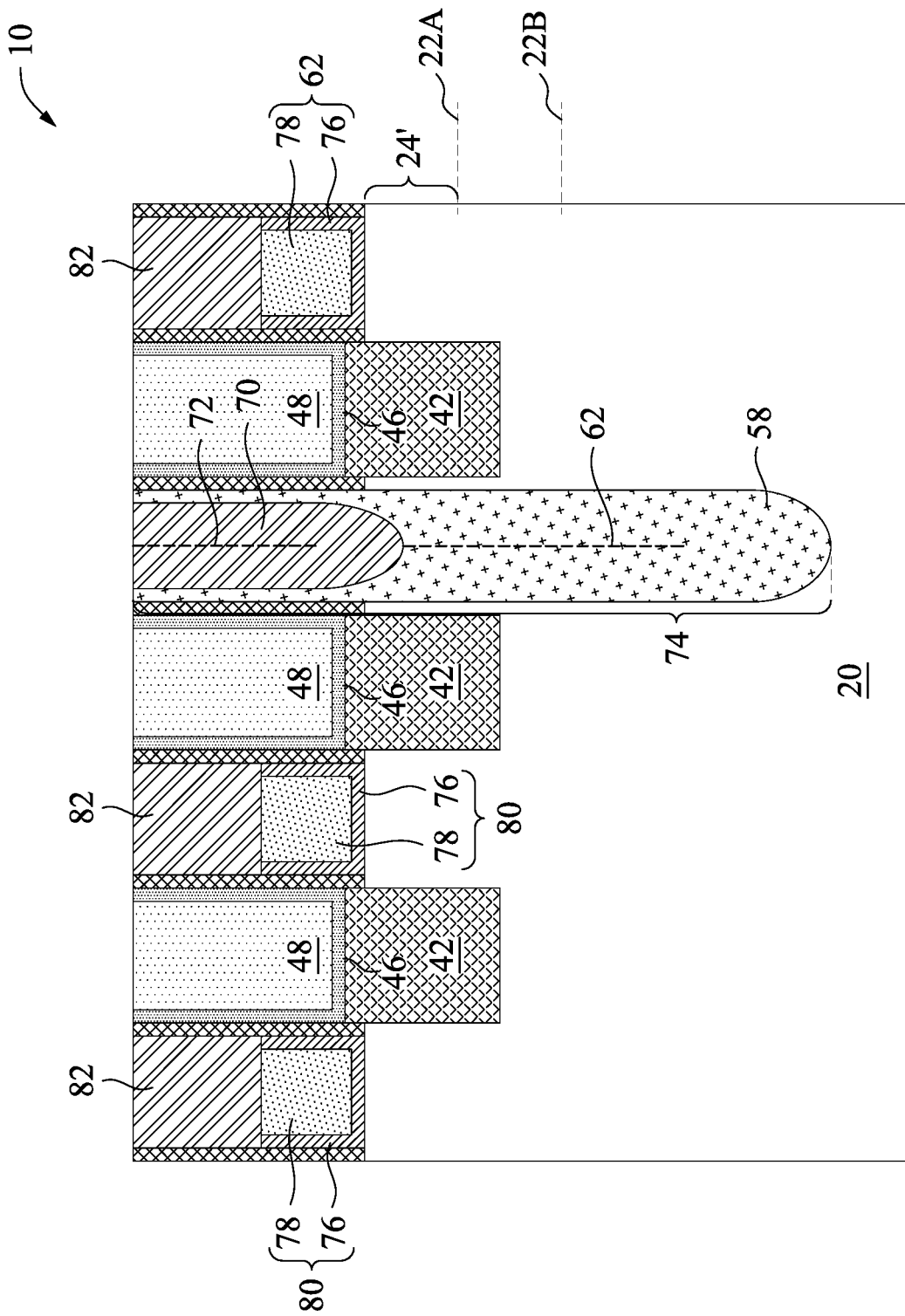
Figure 22:
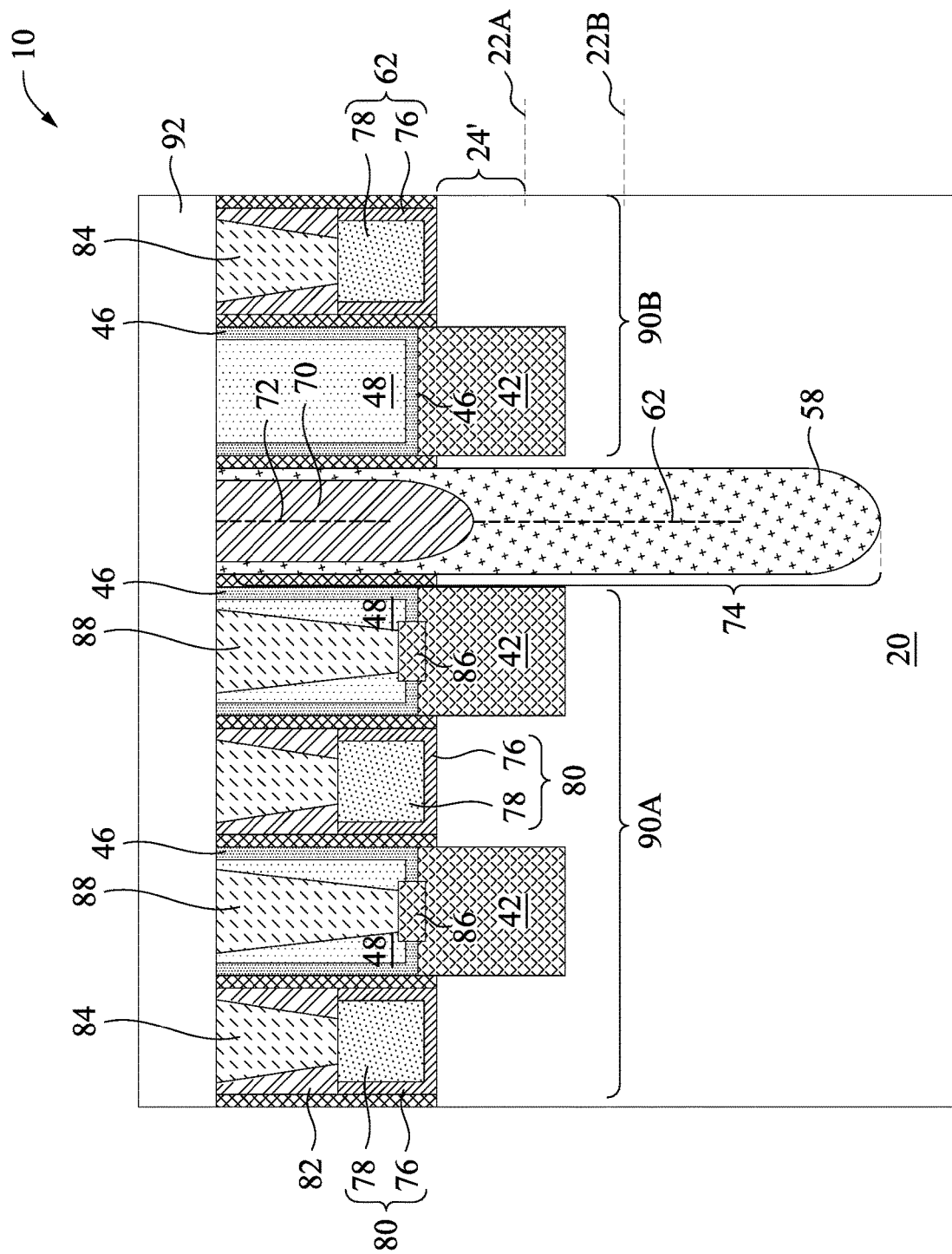

The subsequent processes are essentially the same as in FIGS. 12 through 16. The processes are briefly discussed herein. The details may be found referring to the discussion of FIGS. 12 through 16, and are not repeated herein. Referring to FIG. 19, dielectric layer 70, which may include, or may be free from, seam 72, is deposited. Next, a planarization process such as a CMP process or a mechanical grinding process is preformed to remove the undesirable portions of dielectric layers 58 and 70, and the resulting structure is shown in FIG. 20. Replacement gate stacks 80 are then formed. Next, as shown in FIG. 21, dielectric hard masks 82 are formed to replace the top portions of replacement gate stacks 80. FIG. 22 illustrates the formation of gate contact plug 84, source/drain silicide regions 86, and source/drain contact plugs 88. FinFETs 90A and 90B are thus formed. Dielectric layer 92 is then deposited, which may seal seam 72.

The embodiments of the present disclosure have some advantageous features. By recessing a first dielectric material that has a high bandgap, a more etching-resistance dielectric material is formed as the top portions of fin isolation regions. The first dielectric material, however, may still extend to the top of the fin isolation regions, and hence form an effective leakage barrier to reduce, for example, the leakage current between the source/drain regions on the opposing sides of the corresponding fin isolation region.

In accordance with some embodiments of the present disclosure, a method comprises forming a semiconductor fin protruding higher than top surfaces of isolation regions, wherein the isolation regions extend into a semiconductor substrate; etching a portion of the semiconductor fin to form a trench; filling the trench with a first dielectric material, wherein the first dielectric material has a first bandgap; performing a recessing process to recess the first dielectric material, wherein a recess is formed between opposing portions of the isolation regions; and filling the recess with a second dielectric material, wherein the first dielectric material and the second dielectric material in combination form an additional isolation region, and wherein the second dielectric material has a second bandgap smaller than the first bandgap. In an embodiment, the method further comprises, before the recessing, filling the trench with a third dielectric material, wherein in the recessing process, the third dielectric material is also recessed. In an embodiment, the method further comprises performing a planarization process on the first dielectric material and the second dielectric material, wherein an exposed surface revealed by the planarization process includes a first surface of the first dielectric material, and a second surface of the second dielectric material. In an embodiment, the first surface forms a ring encircling the second surface. In an embodiment, the method further comprises etching an additional dielectric material on a side of the additional isolation region, wherein in the etching the additional dielectric material, the second dielectric material has a lower etching rate than the first dielectric material. In an embodiment, the first dielectric material is a homogenous material, and the first dielectric material fills an entirety of the trench before the recessing process is performed. In an embodiment, the first dielectric material comprises a first seam, and the second dielectric material comprises a second seam overlapping the first seam. In an embodiment, the trench extends lower than the isolation regions.

In accordance with some embodiments of the present disclosure, a device comprises a semiconductor substrate; isolation regions extending into the semiconductor substrate; a dielectric region extending from a first level higher than a top surface of the isolation regions to a second level lower than a bottom surface of the isolation regions, wherein the dielectric region comprises a first layer having a first bandgap, the first layer comprising a lower portion with a bottom contacting the semiconductor substrate; and an upper portion higher than the lower portion, wherein the upper portion is thinner than the lower portion; and a second layer encircled by the upper portion of the first layer, wherein the second layer has a second bandgap lower than the first bandgap. In an embodiment, the lower portion has a uniform thickness, and the upper portion has a second thickness smaller than the uniform thickness. In an embodiment, the device further comprises a semiconductor fin protruding higher than top surfaces of the isolation regions, wherein the dielectric region separates the semiconductor fin into separate portions; a gate stack on the semiconductor fin, wherein the lower portion joins to the upper portion at a level lower than a top surface of the gate stack. In an embodiment, the lower portion of the first layer joins to the upper portion at the level lower than a top surface of the semiconductor fin. In an embodiment, the first bandgap is greater than the second bandgap by a difference greater than about 2 eV. In an embodiment, the first dielectric material comprises silicon oxide, and the second dielectric material comprises silicon nitride. In an embodiment, the second layer comprises an additional lower portion comprising a first seam therein; and an additional upper portion over the additional lower portion, wherein the additional upper portion comprises a second seam separated from the first seam. In an embodiment, the additional lower portion and the additional upper portion are formed of a same material, and the device comprises an interface layer separating the additional lower portion of the second layer from the upper portion of the first layer, and the interface layer comprises the same material and further comprises additional oxygen.

In accordance with some embodiments of the present disclosure, a device comprises a substrate; isolation regions extending into the substrate; a semiconductor fin protruding higher than top surfaces of the isolation regions; a first epitaxy semiconductor region and a second epitaxy semiconductor region extending into the semiconductor fin; an isolation region separating the first epitaxy semiconductor region and the second epitaxy semiconductor region from each other, the isolation region comprising a first dielectric material comprising a first portion higher than the semiconductor fin and a second portion lower than the semiconductor fin, wherein the first portion is narrower than the second portion; and a second dielectric material encircled by the first portion of the first dielectric material, wherein the second dielectric material comprises a third portion higher than the semiconductor fin and a fourth portion lower than the semiconductor fin, and wherein the fourth portion is narrower than the third portion. In an embodiment, the first dielectric material has a first bandgap greater than a second bandgap of the second dielectric material. In an embodiment, the third portion and the fourth portion comprise a first seam and a second seam, respectively, and the first seam is separated from the second seam by a portion of the second dielectric material. In an embodiment, the first seam overlaps the second seam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor substrate;
   isolation regions extending into the semiconductor substrate;
   a dielectric region extending from a first level higher than a top surface of the isolation regions to a second level lower than a bottom surface of the isolation regions, wherein the dielectric region comprises:
      a first layer having a first bandgap, the first layer comprising:
         a lower portion with a bottom contacting the semiconductor substrate; and
         an upper portion higher than the lower portion, wherein the upper portion is thinner than the lower portion; and
      a second layer encircled by the upper portion of the first layer, wherein the second layer has a second bandgap lower than the first bandgap.

2. The device of claim 1, wherein the lower portion a straight and vertical sidewall contacting the second layer.

3. The device of claim 1 further comprising:
   a semiconductor fin protruding higher than top surfaces of the isolation regions, wherein the dielectric region separates the semiconductor fin into separate portions; and
   a gate stack on the semiconductor fin, wherein the lower portion joins to the upper portion at a level lower than a top surface of the gate stack.

4. The device of claim 3, wherein the lower portion of the first layer joins to the upper portion at the level lower than an additional top surface of the semiconductor fin.

5. The device of claim 1, wherein the first bandgap is greater than the second bandgap by a difference greater than about 2 eV.

6. The device of claim 1, wherein the first layer comprises silicon oxide, and the second layer comprises silicon nitride.

7. The device of claim 1, wherein the second layer comprises:
   an additional lower portion comprising a first seam therein; and
   an additional upper portion over the additional lower portion, wherein the additional upper portion comprises a second seam separated from the first seam.

8. The device of claim 7, wherein the additional lower portion and the additional upper portion are formed of a same material, and the device comprises an interface layer separating the additional lower portion of the second layer from the upper portion of the first layer, and the interface layer comprises the same material and further comprises additional oxygen.

9. A device comprising:
   a substrate;
   isolation regions extending into the substrate;
   a semiconductor fin protruding higher than top surfaces of the isolation regions;
   a first epitaxy semiconductor region and a second epitaxy semiconductor region extending into the semiconductor fin; and
   an isolation region separating the first epitaxy semiconductor region and the second epitaxy semiconductor region from each other, the isolation region comprising:
      a first dielectric material comprising a first upper portion higher than the semiconductor fin and a first lower portion lower than the semiconductor fin, wherein the first upper portion is thinner than the first lower portion; and
      a second dielectric material encircled by the first upper portion of the first dielectric material, wherein the second dielectric material comprises a second upper portion higher than the semiconductor fin and a second lower portion lower than the semiconductor fin, and wherein the second lower portion is thinner than the second upper portion.

10. The device of claim 9, wherein the first dielectric material has a first bandgap greater than a second bandgap of the second dielectric material.

11. The device of claim 9, wherein the second upper portion and the second lower portion comprise a first seam and a second seam, respectively, and the first seam is separated from the second seam by a portion of the second dielectric material.

12. The device of claim 11, wherein a bottom of the first seam is higher than a top end of the second seam.

13. The device of claim 11, wherein the first seam is vertically aligned with the second seam.

14. The device of claim 9, wherein the second upper portion and the second lower portion are formed of a same dielectric material, and have a distinguishable interface in between.

15. The device of claim 9, wherein the second upper portion and the second lower portion are formed of different dielectric materials.

16. A device comprising:
a semiconductor substrate;
a first source/drain region and a second source/drain region extending into the semiconductor substrate; and
a dielectric region between the first source/drain region and the second source/drain region, wherein the dielectric region comprises:
- an inner layer comprising a first dielectric material, wherein the inner layer comprises a first seam and a second seam over the first seam, and wherein the second seam is spaced apart from the first seam; and
- an outer layer comprising a second dielectric material different from the first dielectric material, the outer layer comprising:
  - an upper portion encircling the inner layer; and
  - a lower portion overlapped by the inner layer.

17. The device of claim 16, wherein the upper portion forms a distinguishable interface with the lower portion.

18. The device of claim 17, wherein the first seam extends to the distinguishable interface, and the second seam is higher than and spaced apart from the distinguishable interface.

19. The device of claim 16, wherein the second seam is vertically aligned to the first seam.

20. The device of claim 16, wherein the first dielectric material has a lower bandgap than the second dielectric material.

* * * * *